United States Patent [19]

Prioste

[11] 4,128,872

[45] Dec. 5, 1978

[54] HIGH SPEED DATA SHIFTER ARRAY

[75] Inventor: Jerry E. Prioste, Scottsdale, Ariz.

[73] Assignee: Motorola, Inc., Schaumburg, Ill.

[21] Appl. No.: 808,221

[22] Filed: Jun. 20, 1977

[51] Int. Cl.$^2$ .......................... G11C 19/00; G06F 1/00
[52] U.S. Cl. .................................................. 364/900
[58] Field of Search ... 364/900 MS File, 200 MS File, 364/715, 757

[56] References Cited

U.S. PATENT DOCUMENTS

| | | | |
|---|---|---|---|
| 3,106,698 | 10/1963 | Unger | 364/200 |
| 3,287,703 | 11/1966 | Slotnick | 364/200 |
| 3,371,320 | 2/1968 | Lachenmayer | 364/900 |
| 3,436,737 | 4/1969 | Iverson | 364/900 |
| 3,510,846 | 5/1970 | Goldschmidt | 364/900 |
| 3,701,976 | 10/1972 | Shively | 364/200 |
| 3,760,368 | 9/1973 | Dailey | 364/900 |
| 3,887,799 | 6/1975 | Lindgren | 364/900 |
| 3,914,744 | 10/1975 | Brown | 364/900 |
| 3,934,132 | 1/1976 | Desmonds | 364/900 |
| 3,938,102 | 2/1976 | Morrin | 364/900 |
| 3,961,750 | 6/1976 | Dao | 364/900 |

Primary Examiner—James D. Thomas
Attorney, Agent, or Firm—Joe E. Barbee

[57] ABSTRACT

A high speed digital data shifter capable of processing a plurality of parallel data bits and comprising a plurality of programmable data shifters arranged in an array. The plurality of programmable data shifters each have shift function select inputs, scale factor inputs, and a sign bit input and are capable of shifting data right, shifting data left, rotating data right, rotating data left, shifting using two's complements, and forcing the output to a predetermined logic level. The high speed array is capable of shifting data and of rotating data right and left. A plurality of scale factor terminals are provided for receiving scale factor commands. The scale factor terminals are coupled to the programmable data shifters for controlling the number of positions that data is shifted by each programmable data shifter. A plurality of logic gates receive and decode shift select function commands. Outputs of the plurality of logic gates are coupled to the programmable data shifters to provide shift function controls.

15 Claims, 21 Drawing Figures

FIG. 7

| SHIFT SELECT | | SCALE FACTOR | | | SIGN BIT | | | 181,182 | | | 180 | | | 185 | | | 183,184 | | | 187,188 | | | 186 | | |
|---|---|---|---|---|---|---|---|---|---|---|---|---|---|---|---|---|---|---|---|---|---|---|---|---|---|
| Y | X | S5 | S4 | | 82 | 84 | 86 | ST2 | ST1 | ST0 | ST2 | ST1 | ST0 | ST2 | ST1 | ST0 | ST2 | ST1 | ST0 | ST2 | ST1 | ST0 | ST2 | ST1 | ST0 |
| O | O | O | O | | — | — | — | — | — | O | — | — | O | O | — | O | O | — | O | O | O | O | O | — |
| — | O | O | O | | ID47 | — | — | — | — | O | — | — | O | — | O | O | — | — | O | O | O | O | O | O | — |
| — | — | O | O | | — | — | — | — | — | — | — | — | — | O | O | — | O | O | — | — | — | O | O | O | — |
| O | — | O | O | | — | — | — | O | — | O | — | — | O | — | O | O | — | — | O | — | O | — | O | O | — |
| O | O | — | O | | — | ID47 | — | O | O | O | O | O | O | O | — | O | — | — | O | O | — | O | O | — | O |
| — | O | — | O | | ID47 | — | — | O | O | O | O | O | O | — | O | O | — | — | O | O | O | O | — | — | O |
| — | — | — | O | | — | — | — | O | O | — | O | O | O | O | O | O | O | O | O | O | — | O | O | — | O |
| O | — | — | O | | — | — | — | O | O | O | O | O | O | — | O | O | — | — | O | — | O | — | O | — | O |
| O | O | — | — | | — | — | — | O | O | O | — | — | O | O | O | O | O | O | O | O | O | — | — | — | O |
| — | O | — | — | | — | ID47 | — | O | O | O | O | O | O | O | O | O | O | O | O | O | O | — | — | — | O |
| — | — | — | — | | ID47 | — | — | O | O | O | O | O | O | — | — | O | O | O | — | — | O | — | O | O | O |
| O | — | — | — | | — | — | — | O | O | O | O | O | O | O | O | O | O | O | O | O | O | O | — | — | O |

| SHIFT SELECT | | SCALE FACTOR | | SIGN BIT SHIFTER | | | | 230,231,232,233 | | | 237 | | | 234,235,236 | | | 240,241 | | | 238,239 | | | 243,244,245 | | | 242 | | |
|---|---|---|---|---|---|---|---|---|---|---|---|---|---|---|---|---|---|---|---|---|---|---|---|---|---|---|---|---|
| Y | X | S5 | S4 | 233 | 236 | 239 | 242 | ST2 | ST1 | ST0 | ST2 | ST1 | ST0 | ST2 | ST1 | ST0 | ST2 | ST1 | ST0 | ST2 | ST1 | ST0 | ST2 | ST1 | ST0 | ST2 | ST1 | ST0 |
| O | O | O | O | − | − | − | − | − | − | O | O | O | O | O | − | O | O | O | O | O | O | − | O | O | O | O | O | − |
| − | O | O | O | ID63 | − | − | − | − | − | O | O | − | O | O | − | O | O | O | O | O | O | − | O | O | O | O | O | − |
| − | − | O | O | − | − | − | − | − | − | O | O | O | O | O | − | O | O | O | O | O | − | O | O | − | O | O | O | − |
| O | − | O | O | − | − | − | − | − | O | O | O | O | − | − | O | − | O | O | − | − | − | O | O | O | O | O | O | − |
| O | O | − | − | − | ID63 | − | − | O | O | O | − | − | O | − | − | O | O | − | O | O | − | O | O | O | O | O | O | − |
| − | O | − | − | − | − | − | − | O | O | O | O | O | O | − | O | O | O | − | O | O | − | O | O | O | O | O | O | − |
| − | − | − | − | − | − | − | − | O | O | O | O | O | O | O | − | O | O | − | O | O | − | O | O | O | O | O | O | − |
| O | − | − | − | − | − | − | − | O | O | O | O | O | − | O | O | O | O | O | − | − | O | − | O | O | O | O | O | O |
| O | O | O | − | ID63 | ID63 | − | − | O | O | O | O | O | O | − | O | O | O | O | − | O | − | O | O | O | O | O | O | O |
| − | O | O | − | − | ID63 | − | − | O | − | O | − | O | O | O | O | O | O | O | O | O | − | O | O | O | O | − | − | O |
| − | − | O | − | − | − | − | − | O | − | O | O | O | − | O | O | O | O | O | O | O | − | O | O | O | O | − | − | O |
| O | − | O | − | − | − | − | − | O | O | O | O | O | O | O | O | O | O | O | O | O | O | O | O | O | O | − | − | O |
| O | O | − | − | ID63 | ID63 | ID63 | − | O | O | O | O | O | − | O | O | O | O | O | − | O | − | O | O | O | O | O | O | O |
| − | O | − | − | − | ID63 | ID63 | − | O | O | O | O | O | O | O | O | O | O | O | O | O | O | O | − | O | O | O | O | O |
| − | − | − | − | − | − | ID63 | − | O | O | O | O | O | O | O | O | O | O | O | O | O | O | O | O | O | O | O | O | O |
| O | − | − | − | − | − | − | − | O | O | O | − | O | O | O | O | O | O | O | O | O | − | O | O | O | O | O | O | O |

FIG. 16

HIGH SPEED DATA SHIFTER ARRAY

CROSS REFERENCE TO RELATED APPLICATION

A related application is my application Ser. No. 808,223 filed on the same date as the present application and assigned to the assignee of the present application. This related application is incorporated herein by reference.

BACKGROUND OF THE INVENTION

This invention relates, in general, to digital data shifters and, more particularly, to high speed digital data shifters capable of handling many parallel bits of digital data and of controllably rotating and shifting the digital data.

Digital data processors often require the displacement of an ordered set of computer characters one or more places to the left or right. If the characters are the digits of a numerical expression, a shift is equivalent to multiplying by a power of the base two. Generally speaking, shift registers are not a practical means for shifting large quantities of digital data because of the great numbers of shift registers that would be required and because the conventional shift registers respond to a clock pulse which is inherently too slow a process for handling data in modern high speed computers. Multiplexers have also been used in the past which have generally proven to be faster than shift registers. More recently, integrated circuits capable of handling eight bits have been arranged in arrays to handle larger quantities of data, however, these arrays require a large number of integrated circuit chips and are rather limited functionally. In other words, the versatility of the array is limited.

Accordingly, it is an object of the present invention to provide an improved digital data shifter array.

Another object of the present invention is to provide a digital data shifter array capable of rotating data and of shifting data right and left wherein the data comprises many bits of data in a parallel format.

Yet another object of the present invention is to provide a versatile high speed digital data shifter array having a reduced parts count.

SUMMARY OF THE INVENTION

In carrying out the above and other objects in one preferred form, there is provided an improved high speed digital data shifter array for shifting digital data. A plurality of programmable data shifters are arranged in an array. The programmable data shifters are responsive to scale factor inputs and to shift function select inputs. A plurality of scale factor terminals for receiving scale factor commands are coupled to the scale factor inputs of the programmable digital data shifters and control the number of positions that data is shifted by each programmable data shifter. A plurality of logic gates receive and decode shift function commands. The plurality of logic gates have outputs that provide shift function controls for the programmable data shifters.

The subject matter which is regarded as the invention is particularly pointed out and distinctly claimed in the concluding portion of the specification. The invention itself, however, together with further objects and advantages thereof, may be better understood by reference to the following description taken in conjunction with the accompanying drawings.

BRIEF DESCRIPTION OF THE DRAWINGS

FIG. 4 is a truth table for the embodiment of the invention illustrated in FIG. 3;

FIG. 7 is a truth table for the embodiment illustrated in FIG. 6;

FIG. 9 is a truth table for the embodiment of the invention illustrated in FIG. 8;

FIG. 14 is a truth table for the embodiment of the invention illustrated in FIGS. 13a and 13b;

FIG. 16 is a truth table for the embodiment of the invention illustrated in FIGS. 15a and 15b.

The exemplifications set out herein illustrate the preferred embodiments of the invention, and such exemplifications are not to be construed as limiting in any manner.

DESCRIPTION OF THE PREFERRED EMBODIMENT

Figure 1:
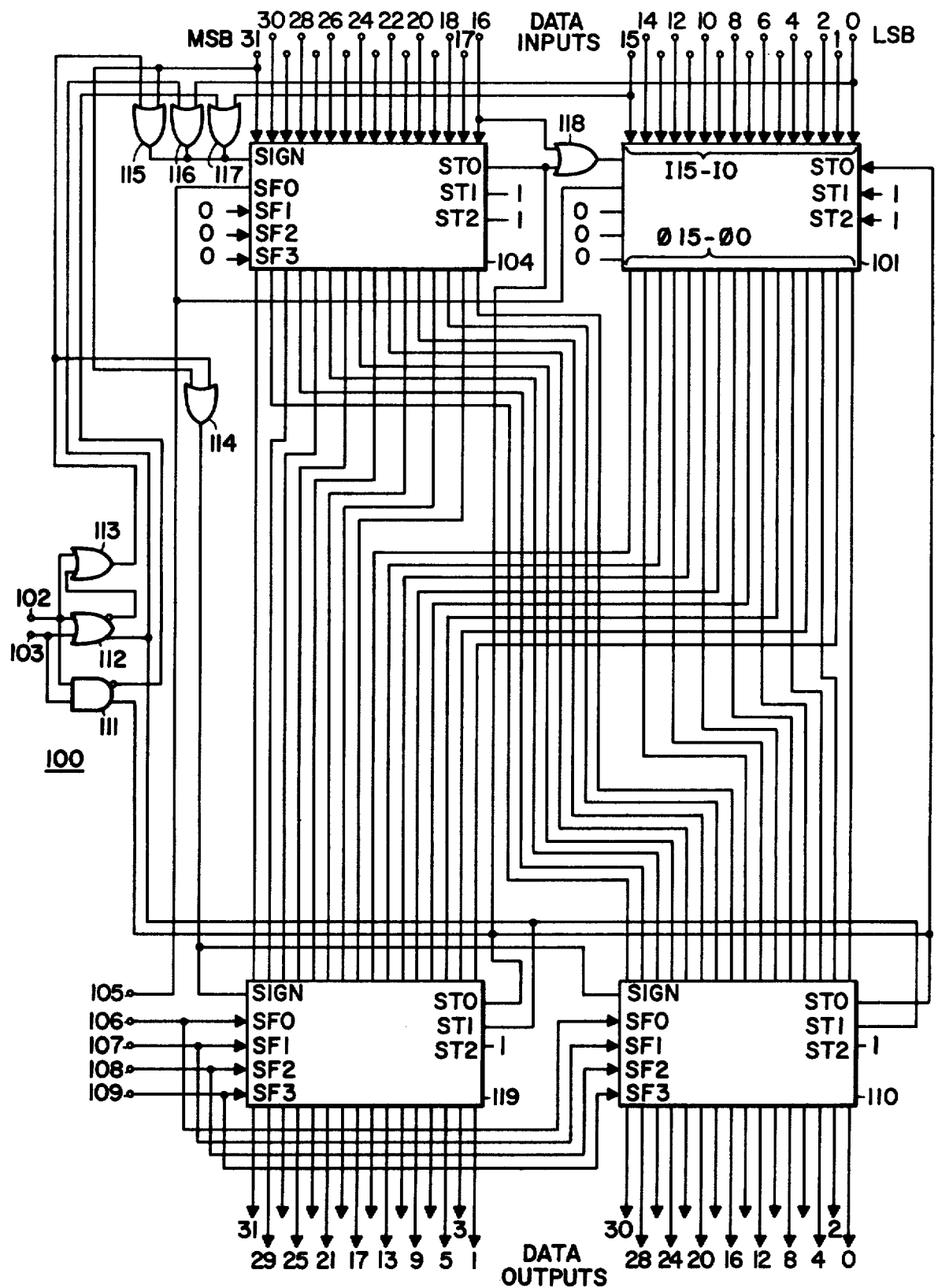
FIG. 1 is one embodiment of the invention capable of handling 32 bits of digital data.

FIG. 1 illustrates a 32 bit digital data shift/rotate array 100 which is capable of performing rotate right, logic shift right, arithmetic shift right, and logic shift left operations. Four programmable data shifters 101, 104, 110 and 119 are arranged in an array to receive, shift, and output the 32 bits of data. Each programmable data shifter 101, 104, 110, and 119 is capable of handling sixteen bits of data under the individual shift function commands ST0, ST1, and ST2. A complete description of the programmable data shifters is given in my copending patent application filed on the same data as the present application and entitled "Programmable Multibit Shifter". My copending patent application Ser. No. 808,223 is hereby incorporated herein by reference. For ease of understanding the present invention the following truth table relating to the shift function commands of the programmable data shifters is included:

| Shift Function | | | |
|---|---|---|---|
| ST2 | ST1 | ST0 | Description |
| 0 | 0 | 0 | Sign bit is placed at all outputs |
| 0 | 0 | 1 | The outputs are forced to logic "1" |
| 0 | 1 | 0 | Shift left using two's complement |
| 0 | 1 | 1 | Shift right using two's complement |
| 1 | 0 | 0 | Rotate right |
| 1 | 0 | 1 | Rotate left |
| 1 | 1 | 0 | Arithmetic shift right |
| 1 | 1 | 1 | Arithmetic shift left |

The function performed by each programmable data shifter 101, 104, 110, or 119 is controlled by the three inputs ST0, ST1, and ST2, however, the number of the positions that the data is shifted or rotated is controlled by scale factor inputs SF0, SF1, SF2, and SF3. The scale factor inputs are binary in form and accordingly can provide for sixteen commands which can cause data to be shifted from zero through fifteen positions. Shifters 101, 104, 110, and 119 also have a sign input. The manner in which the sign input is used by shifters 101, 104, 110, and 119 is controlled by the shift function inputs. The shift function inputs can cause a sign bit to be placed at all outputs, or when an arithmetic shift right or left is performed the vacated bit positions are filled with the sign bit. Operation of shift/rotate array 100 is controlled by shift selector X and Y inputs at terminals 102 and 103 respectively. The number of positions which data is shifted by each programmable data shifter 101, 104, 110, and 119 in array 100 is controlled by an S0 input on terminal 105, an S1 input on terminal 106, an S2 input on terminal 107, an S3 input on terminal 108, and an S4 input of terminal 109. The S0 input is connected to the SF0 input of shifters 101 and 104. The SF1, SF2, and SF3 inputs of shifters 101 and 104 are supplied with a logic "0". The S1 input of array 100 is connected to the SF0 input of shifters 110 and 119 while the S2, S3, and S4 inputs are respectively connected to the SF1, SF2, and SF3 inputs of shifters 110 and 119. The input at terminal 102 is coupled to OR gate 112 which has a normal and an inverting output. The normal output of OR gate 112 is connected to the ST1 inputs of shifters 110 and 119, and is also coupled to the sign input of shifter 104 through OR gate 116. The inverting output of OR gate 112 is connected to an input of OR gate 113. A second input of OR gate 113 is connected to the input on terminal 102. The output of OR gate 113 is coupled to the sign inputs of shifters 110 and 119 through an OR gate 114. The output of OR gate 113 is also coupled to the sign bit of shifter 104 through OR gate 115. The X and Y inputs are also connected to the inputs of AND gate 111 which has a normal plus an inverting output. The inverting output of AND gate 111 is connected to an input of an OR gate 117. It should be noted that OR gates 114, 115, 116, and 117 all have an input connected to a data input of array 100. The outputs of OR gates 115, 116, and 117 are tied together to produce a wired AND function which is connected to the sign input of data shifter 104. The normal output of AND gate 111 is connected to the ST0 inputs of the four data shifters 101, 104, 110, and 119, and also to an input of an OR gate 118. The output of OR gate 118 is connected to the sign input of the first data shifter 101. Logic gates 111 through 118 receive and decode the X and Y shift select inputs for array 110. Logic "1's" are connected to the ST1 and ST2 inputs of shifters 101 and 104 and to the ST2 inputs of shifters 110 and 119. Since the scale factor inputs of shifters 101 and 104 only have an input on the SF0 scale factor input these shifters can only shift data one position. An input on SF1, SF2, or SF3 would produce a 2, 4, or 8 position shift respectively.

Data inputs 0 through 15 are connected to shifter 101 while inputs 16 through 31 are coupled to shifter 104. The "0" data input, of course, is the least significant bit (LSB) while data input 31 is the most significant bit (MSB). The manner in which the outputs of shifters 101 and 104 are connected to the inputs of shifters 110 and 119 provide array 100 with the capability of handling thirty-two bits of digital data with a reduced number of parts, i.e., four programmable data shifters and eight logic gates. The first output $\phi00$ of shifter 101 is connected to the first input, I00, of shifter 110 while the second output, $\phi01$, of 101 is connected to the first input I00, of shifter 119. Every other output of shifters 101 and 104 is alternated in the same manner between the inputs of shifters 110 and 119. Then for the outputs of array 100, all the even outputs from 0 through 30 are taken from programmable data shifter 110 while all the odd outputs 1 through 31 inclusive are taken from shifter 119.

Each programmable data shifter 101, 104, 110, and 119 is one monolithic integrated circuit chip. The arrangement of chips for the embodiment of the invention illustrated in FIG. 1 will produce a two chip delay for the digital data. Programmable data shifters 101 and 104 can shift data right or left one position. However, when data shifters 110 and 119 are commanded to shift data one position the data actually gets shifted two places because of the way the inputs and outputs of shifters 110 and 119 are wired. This wiring arrangement requires less integrated circuit chips when building a thirty-two bit shift/rotate array.

It should be noted that in describing FIG. 1 negative logic was used and will be used in describing the other embodiments of the invention.

Figure 2:
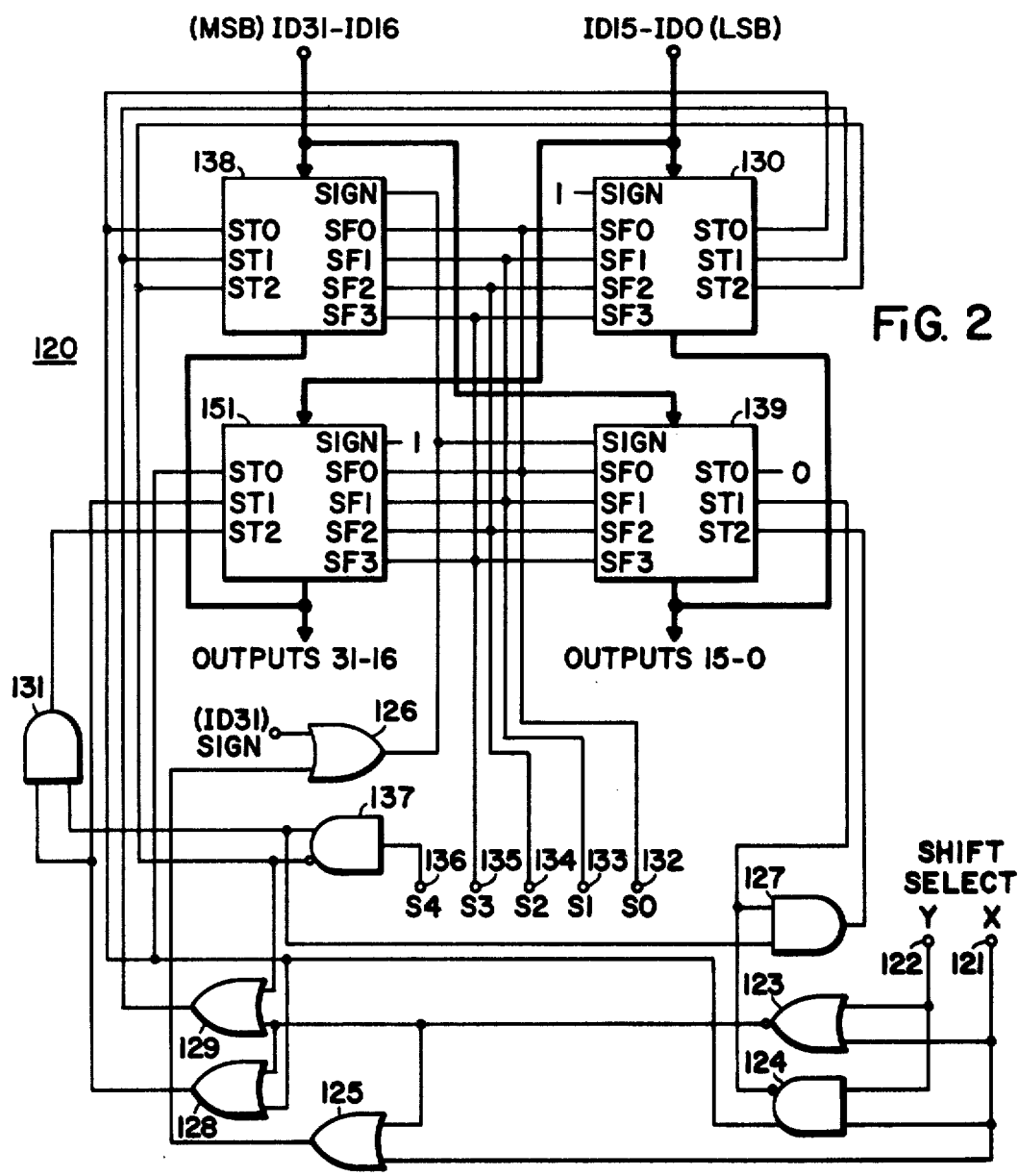
FIG. 2 is another embodiment of the invention capable of handling 32 bits of digital data and providing less time delay than does the embodiment of FIG. 1.

FIG. 2 illustrates a thirty-two bit shift/rotate array 120 having one integrated circuit chip delay. Four programmable data shifters 130, 138, 139, and 151 are used which are identical to the programmable data shifters used in FIG. 1 and also in the other FIGS. Sixteen bits of input data 0 through 15 are received by shifter 130. This same input information is connected to the inputs of shifter 151. Input data bits 16 through 31 are connected to the inputs of shifters 138 and 139. The outputs of shifter 130 are connected to the outputs of shifter 139 while the outputs of shifter 138 are connected to the outputs of shifter 151. Again, outputs connected together produce a wired logic AND function. The interconnection of the programmable data shifters as illustrated provides a one integrated circuit chip delay for the data, from the input to the output of array 120.

Shift select functions X and Y are received on terminals 121 and 122 respectively. The X input is connected to NOR gate 123, AND gate 124, and OR gate 125. The Y input is connected to the other inputs of NOR gate 123 and AND gate 124. AND gate 124 has a normal plus an inverting output. The inverting output is connected to an input of AND gate 127 and to the ST1 input of shifter 139. The normal output of AND gate 124 is connected to an input of OR gate 128 and to the ST0 inputs of shifters 130, 138 and 151. The output of NOR gate 123 is connected to the other input of OR gate 125 and to inputs of OR gate 128 and 129. The output of OR gate 128 is connected to an input of AND gate 131 and to the ST1 input of shifter 151. The output of OR gate 129 is connected to the ST1 inputs of shifters 130 and 138. Five scale factor inputs S0, S1, S2, S3, and S4 are received respectively at input terminals 132, 133, 134, 135, and 136. Scale factor inputs S0, S1, S2, and S3 are directly connected to the SF0, SF1, SF2, and SF3 inputs respectively of shifters 130, 138, 139 and 151. These inputs control the number of positions that the data is shifted by the programmable data shifters. Scale factor input S4 is coupled to the programmable data shifters through some logic gates commencing with AND gate 137. AND gate 137 has a normal and an inverted output. The inverted output is connected to an input of OR gate 129 and to the ST2 input of shifters 130 and 138. The normal output of AND gate 137 is connected to an input of AND gate 131 and to an input of AND gate 127. The output of AND gate 127 is connected to the ST2 input of shifter 139. The output of AND gate 131 is connected to the ST2 input of shifter 151. The output of OR gate 125 is connected to an input of OR gate 126. The other input of OR gate 126, which is a sign bit input, is input data bit 31 (ID31) which is the most significant bit of the input data. The output of OR gate 126 is connected to the sign inputs of shifters 138 and 139. The sign input of the other two data shifters 130 and 151 are logic "1's". A logic "0" is connected to the ST0 input of shifter 139. The embodiment of the invention illustrated in FIG. 2 can shift digital data with one less programmable data shifter integrated circuit chip delay than does the circuit illustrated in FIG. 1, however, it should be noted that an additional logic gate is used in the configuration of FIG. 2. The two shift select inputs X and Y can be decoded by the plurality of logic gates so that shift/rotate array 120 can perform at least four different functions. These four functions are rotate right when both X and Y are logic "0's", logic shift right when the X input is a logic "1" and the Y input is a logic "0", arithmetic shift right when the X input is a logic "0" and the Y input is a logic "1", and logic shift left when both X and Y inputs are logic "1's". These same X and Y input codes are used in all the illustrated embodiments of the present invention.

Figure 3:
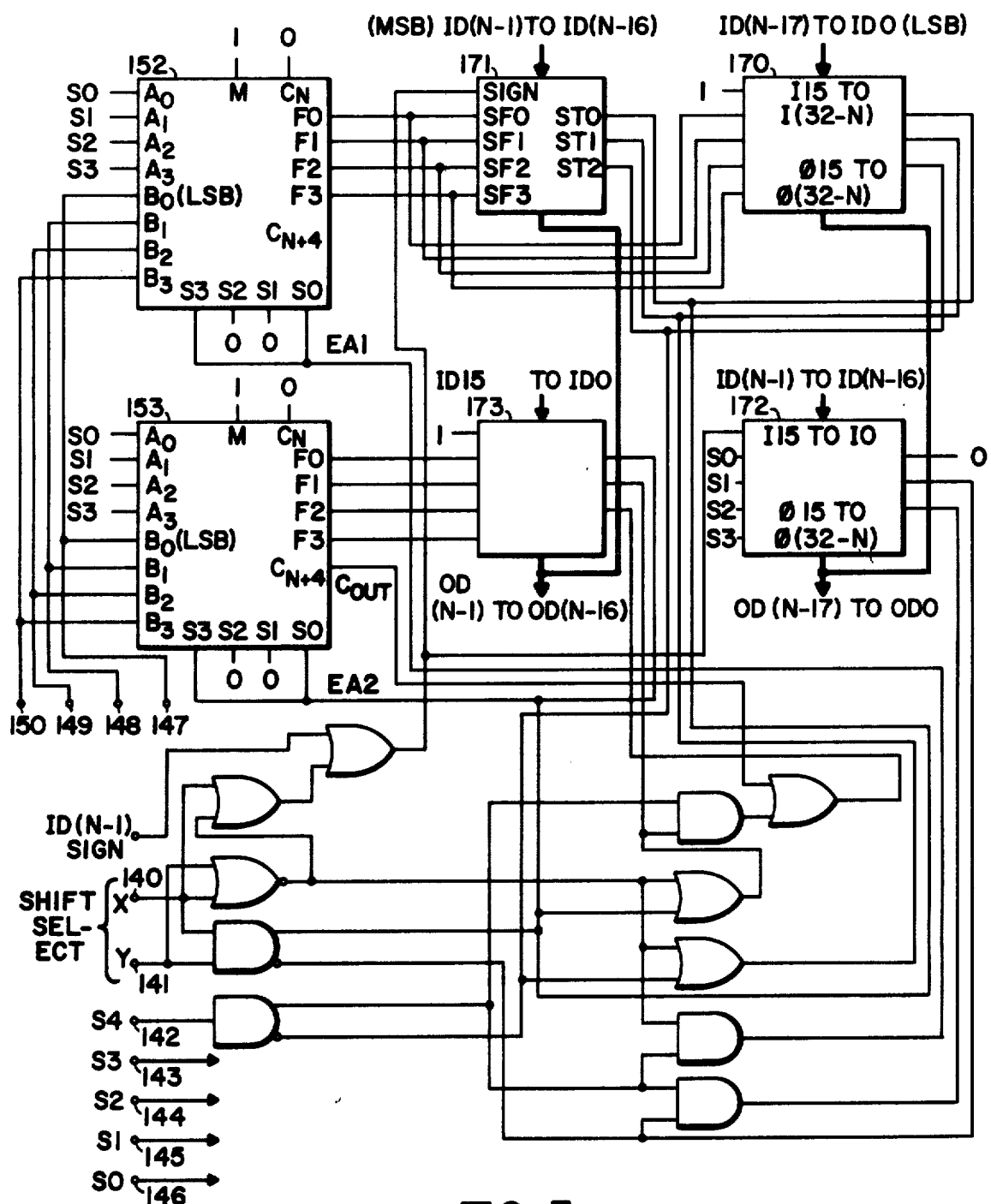
FIG. 3 is another embodiment of the invention capable of handling any number from 17 to 32 digital data bits.

FIG. 3 illustrates an N-bit shift/rotate array wherein N can be any number of bits from 17 to 32. Programmable data shifter 170 receives input data bits 0 through N-17 while programmable data shifter 171 receives input data bits N-16 through N-1. The input data bits received by shifter 173 are 0 through 15, which means that when N is less than 32 some of the inputs to shifter 171 will also appear on the input to shifter 173. However, all the input data bits to shifter 171 are coupled to the inputs of shifter 172 and therefore when N is less than 32, shifters 172 and 173 will share a few inputs. The outputs of shifter 171 are connected to the outputs of shifter 173 while the outputs of shifter 170 are connected to the outputs of shifter 172. This arrangement provides for one integrated circuit chip delay for processing the data from the input of shifters 170 and 171 to the outputs of shifters 172 and 173. It should be noted that in the preferred embodiment the outputs of shifter 172 are from output 32-N to output 15 while the output of the array that is connected to shifter 172 is output data OD0 to output data OD (N-17). Therefore in a case when N is less than 32 the shifter output will not include the lowest order output or outputs. A plurality of scale factor inputs S0, S1, S2, S3, and S4 are received by input terminals 146, 145, 144, 143, and 142 respectively. Inputs S0 through S3 are respectively connected to inputs SF0, SF1, SF2, and SF3 of programmable data shifter 172. The scale factor inputs S0 through S3 are also connected to A0 through A3 inputs respectively of adders 152 and 153. A plurality of logic gates are used to decode the X and Y shift select inputs on terminals 140 and 141. The plurality of logic gates also supply an enable 1 signal for adder 152 and an enable 2 signal for adder 153. A binary code of 32-N is connected to input terminals 147, 148, 149, and 150. The LSB is placed on input 147 and the MSB is placed on input 150. Input terminals 147-150 are connected to the adders 152 and 153. Adders 152 and 153 can add the 32-N binary code to the scale factor inputs S0 through S3 upon command of enable signal 1 or enable signal 2. In the absence of a command the scale factor inputs S0 through S3 are directly coupled to outputs F0 through F3 of adders 152 and 153. The F0 through F3 outputs of adder 152 are connected to the SF0 through SF3 inputs of shifters 170 and 171 while the F0 through F3 outputs of adder 153 are connected to the SF0 through SF3 inputs of shifter 173. Adder 153 has a carry-out ($C_{OUT}$) which is connected to an input of one of the plurality of logic gates. Adders 152 and 153 are four bit adders. One such adder that can be used is a four bit arithmetic logic unit/function generator sold by Motorola, Inc. by the designation MC10181. A logic one is connected to the sign input of shifters 170 and 173, while a logic zero is connected to the ST0 input of shifter 172.

FIG. 4 is a truth table for the N-bit shift/rotate array illustrated in FIG. 3. From the truth table one can obtain the logic equations and from the logic equations one can determine the logic gates needed to complete the array. The logic gates control the shifters in the array by operating the shift function commands. The left most columns labeled "Shift Select Y and X" are the Y and X inputs to terminals 140 and 141. These shift select functions provide the same commands for the array of FIG. 3 as did the shift select functions for FIG. 2. When Y and X are both logic "0's" the array will perform a rotate right function; when Y is a logic "0" and X is a logic "1" a logic shift right operation will be performed; for Y being a logic "1" and X a logic "0" an arithmetic shift right operation will be performed, and when Y and X are both logic "1's" a logic shift left will be performed. These same Y and X shift select functions are used for all embodiments of the invention described herein. The column labeled "Scale Factor MSB S4" is the scale factor input at terminal 142. The carry-out column 153 is the carry-out or $C_{OUT}$ of adder 153. The "Sign Bit" column gives the sign input for shifters 171 and 172. Some of these inputs are whatever input is on ID (N-1) and are designated as N-1 in the table. The column labeled "170 and 171" shows the inputs for shift command functions ST0, ST1, and ST2 of shifters 170 and 171. The column headed "173" and the column headed "172" show the shift command function inputs for shifters 173 and 172 respectively. The dashes appearing in the "Carry-out" column and in the "Sign Bit" columns indicate that it does not matter what the logic level is for these inputs since they are not controlling inputs for that particular operation. The scale factor inputs S0 through S3 are not shown on the truth table since no extra logic gates are required due to the design of the array. Adder 152 of FIG. 3 adds a constant 32-N to the scale factor inputs S0 through S3 during a rotate operation whenever shifters 170 and 171 are in the shift left two's complement mode. The enable 2 input connected to adder 153 is present during all shift left operations. It should be noted that when the array of FIG. 3 is being used as a twenty-four bit shift/rotate array the binary code of 32-N has a "1" in the most significant bit position which would appear on input terminal 150 and the other binary inputs on terminals 147 through 149 will be logic "0's". In such a situation the two adders 152 and 153 can be replaced by logic gates.

Figure 5:
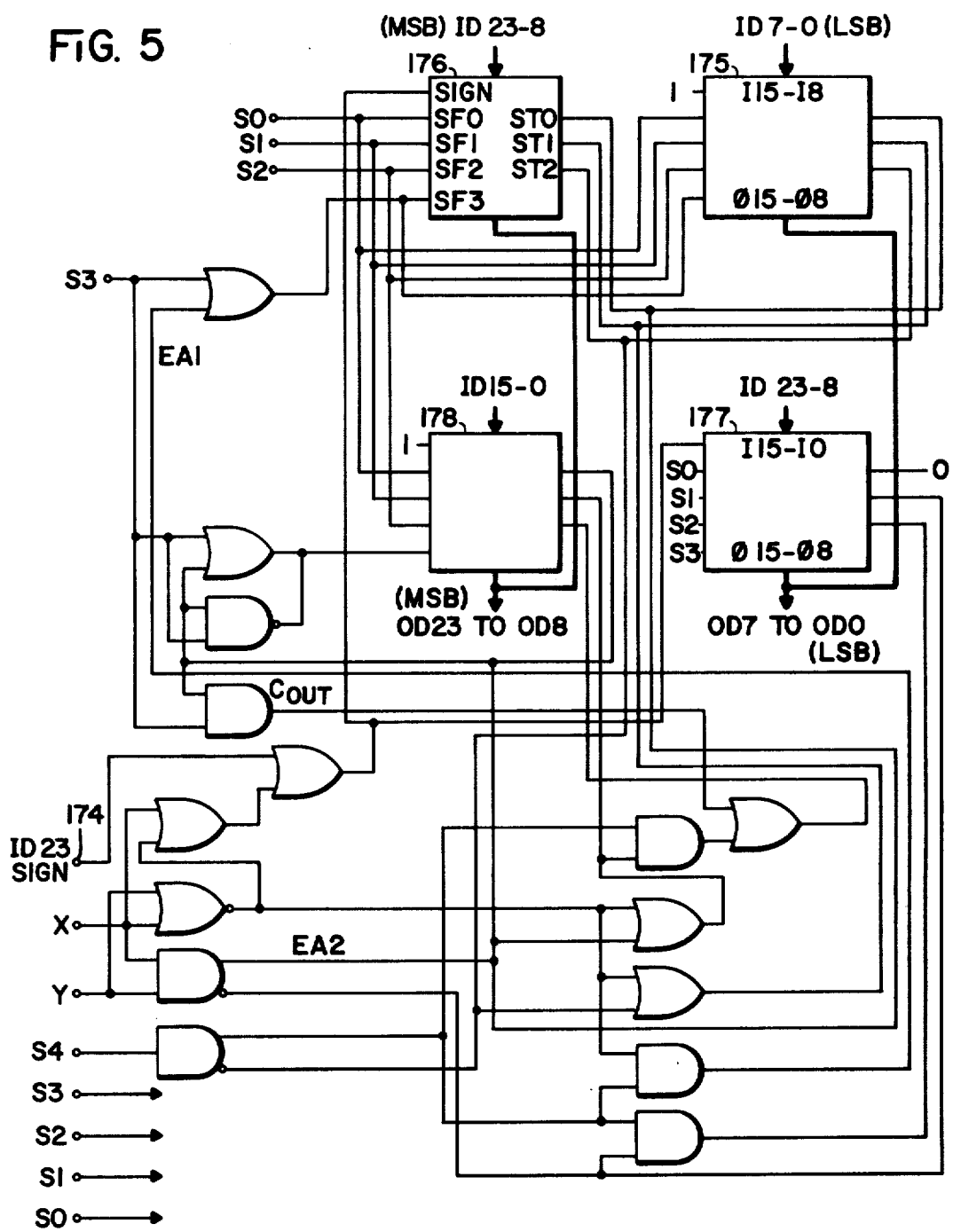
FIG. 5 is an embodiment of the invention capable of handling 34 bits of digital data.

FIG. 5 illustrates a 24 bit shift/rotate array having one integrated circuit chip time delay. Input digital data bits 0 through 7 are connected to programmable data shifter 175 inputs $I_8$ through $I_{15}$ respectively ($I_0$ through $I_7$ are left open at a logic "1") while the digital input data bits 8 through 23 are connected to the inputs of programmable data shifter 176. The digital data inputs for shifter 176 are also connected to the inputs of programmable data shifter 177. Input digital data bits ID0 through ID15 are connected to the inputs for programmable data shifter 178, and therefore shifter 178 has all the same inputs as shifter 175 plus some of the inputs from shifter 176. Scale factor inputs S0 through S2 are coupled to shifters 175 through 178. Scale factor input S3 is connected to shifter 177 and also ORed with EA1 then connected to shifters 175 and 176. Input S3 is also ORed with EA2 and ORed output is connected to input SF3 of shifter 178. The X and Y shift select functions along with scale factor 54 are received and decoded by a plurality of logic gates which provide shift commands for the programmable data shifters. A sign bit input on the terminal 174 is the most significant bit 23 of the input digital data.

It should be noted that output data OD0 through OD7 are taken from shifter 177. These outputs are also connected to the outputs of shifter 175. This connection forms a logic AND function. This is possible when the output logic of the shifter is transistor-transistor logic and positive logic is used with the array, or when the output logic is emittercoupled logic and negative logic is used with the array. It should also be noted that the array outputs OD0 through OD7 correspond to shifter outputs $\phi 08$ through $\phi 15$.

Figure 6:
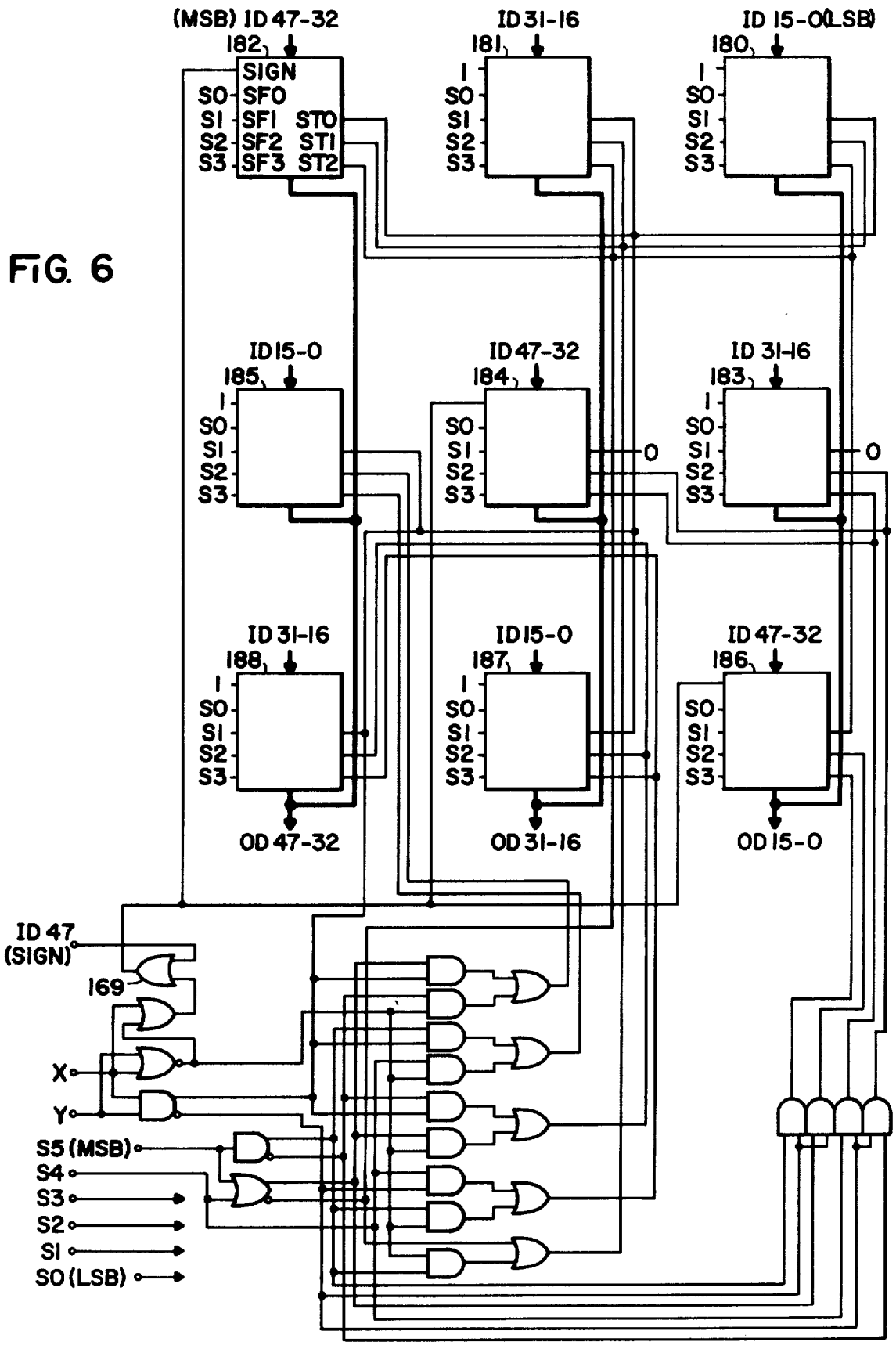
FIG. 6 is another embodiment of the invention which is capable of handling 48 bits of digital data.

FIG. 6 is an embodiment of a forty-eight bit shift/rotate array having one integrated circuit chip delay for the digital data. This array uses nine programmable data shifters 180 through 188. Input data bits 0 through 15 are connected to the inputs of shifters 180, 185, and 187. Input digital data bits 16 through 31 are connected to the inputs of shifters 181, 183, and 188. Input digital data bits 32 through 47 are connected to the inputs of shifters 182, 184, and 186. The outputs of shifters 180, 183, and 186 are all connected together to provide digital data outputs 0 through 15. The outputs of shifters 181, 184 and 187 are all connected in common to provide output digital data bits 16 through 31 while the outputs of shifters 182, 185, and 188 are all connected in common to provide the digital data outputs 32 through 47. The shift select inputs X and Y, for the 48 bit array, are received and decoded by a plurality of logic gates. Six scale factor inputs S0 through S5 are received and cooperate with the X and Y inputs to control the operation of the 48 bit array. It should be noted that all the logic gates could be replaced with two programmable read-only memories (PROM) capable of handling 32 eight-bit words. Input data bit 47 is also coupled to OR gate 169 and serves as a sign bit input for the forty-eight bit array. This array is capable of shifting right or left, rotating right, or performing an arithmetic shift right on 48 bits of digital data in parallel format. All this is accomplished with only nine programmable data shifters and 24 logic gates. A re-arrangement of the logic gates could result in different functions being performed by the array.

FIG. 7 is a truth table for the forty-eight bit shift/rotate array illustrated in FIG. 6. The left most columns "Y and X" are the shift select inputs. Just to the right of the shift select inputs are scale factor inputs S4 and S5 followed by the sign bit inputs to programmable data shifters 182, 184, and 186. To the right of those are the shift function commands supplied to the programmable data shifters starting with 181 and 182, then 180, 185, 183 and 184, 187 and 188, and ending up with shifter 186 shift function command inputs in the far right columns. The dashes in the truth table indicate that the logic signal can be either a logic "0" or a logic "1". In the sign bit columns the most significant input digital data bit 47 (ID47) is shown as the sign bit input in certain rows for shifters 182, 184, or 186. The scale factor inputs control the number of positions data is shifted which can be from zero to fifteen positions.

Figure 8:
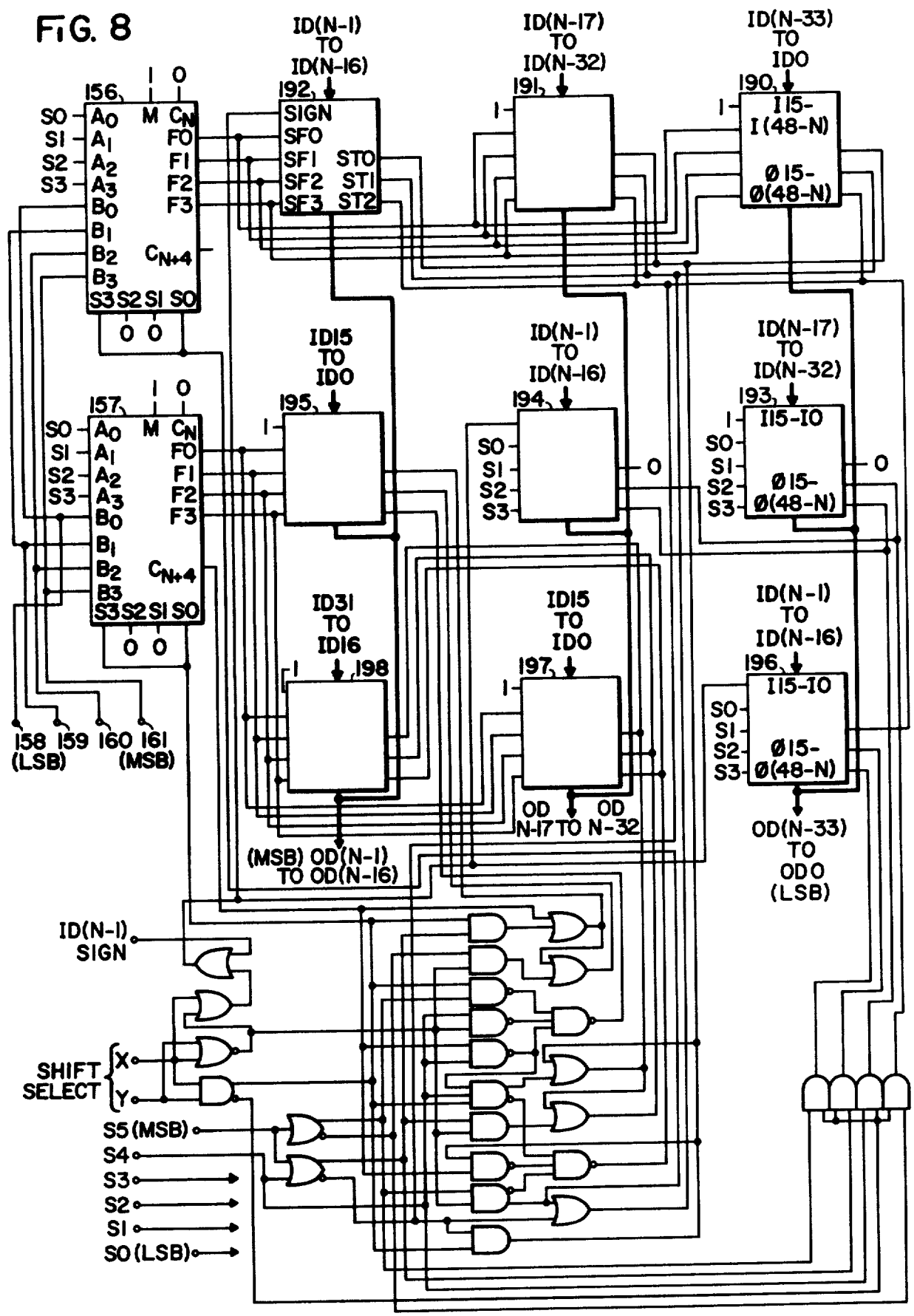
FIG. 8 is an embodiment of the invention capable of handling anywhere from 33 to 48 digital data bits.

FIG. 8 illustrates an N-bit shift/rotate array wherein N can be any number of bits from 33 to 48. This array is arranged to provide a one integrated circuit chip delay. Digital data bit inputs 0 through N-33 are connected to the inputs of programmable data shifter 190. Input digital data bits N-32 through N-17 are connected to the inputs of shifters 191 and 193. Input digital data bits ID0 through ID15 are connected to the inputs of shifters 195 and 197. Input digital data bits N-16 through N-1 are connected to the inputs of shifters 192, 194, and 196. Input data bits ID16 through ID31 are connected to the inputs of shifter 198. The outputs of shifters 190, 193, and 196 are all connected together to provide output digital data bits 0 through N-33 and the outputs of shifters 191, 194, and 197 are all connected together to provide output digital data bits N-32 through N-17. The outputs of shifters 192, 195, and 198 are all connected in common to provide output digital data bits N-16 through N-1. Scale factor inputs S0 through S5 and shift select inputs X and Y are used in controlling the operation of the N bit shift/rotate array. A plurality of logic gates along with adders 156 and 157 are used to provide decoding functions. Input terminals 158, 159, 160, and 161 are connected to a binary code of 48-N to provide a constant to be controllably added to scale factor inputs S0 through S3 by adders 156 and 157. N is the number of data bits between 33 and 48 which are selected to be processed by the array.

Figure 9:
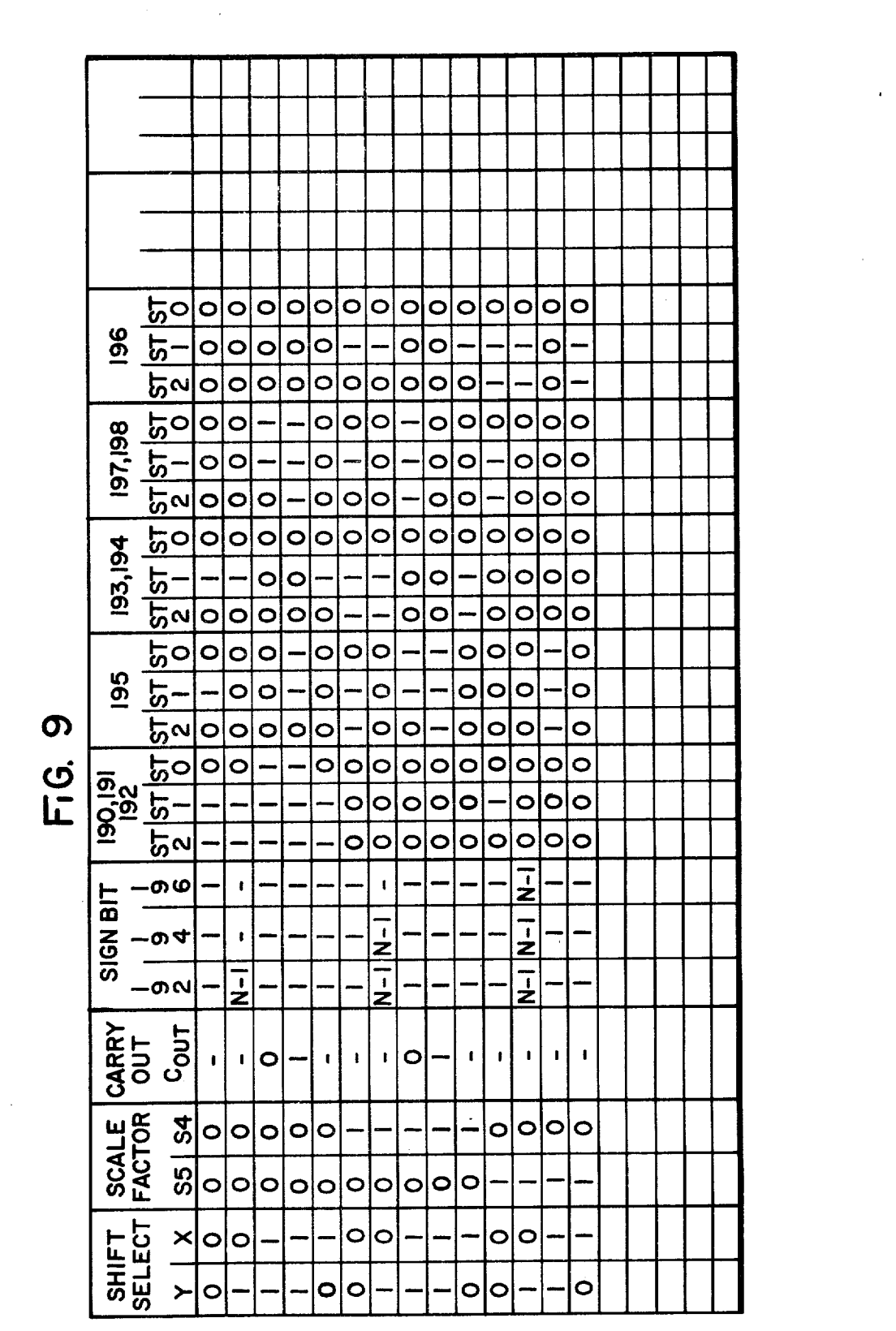

FIG. 9 is a truth table for the N bit shift/rotate array illustrated in FIG. 8. The truth table is laid out similar to the truth table illustrated in FIG. 7 which was described hereinbefore. The sign bit columns indicate an input data bit ID(N-1) which is the most significant bit for the input digital data and is designated as N-1 in the table because of limited space in the table. In many cases, the logic circuitry associated with the array can be simplified for certain numbers of bits from 33 to 48, which will be apparent to those skilled in the art with the use of the truth table.

Figure 10:
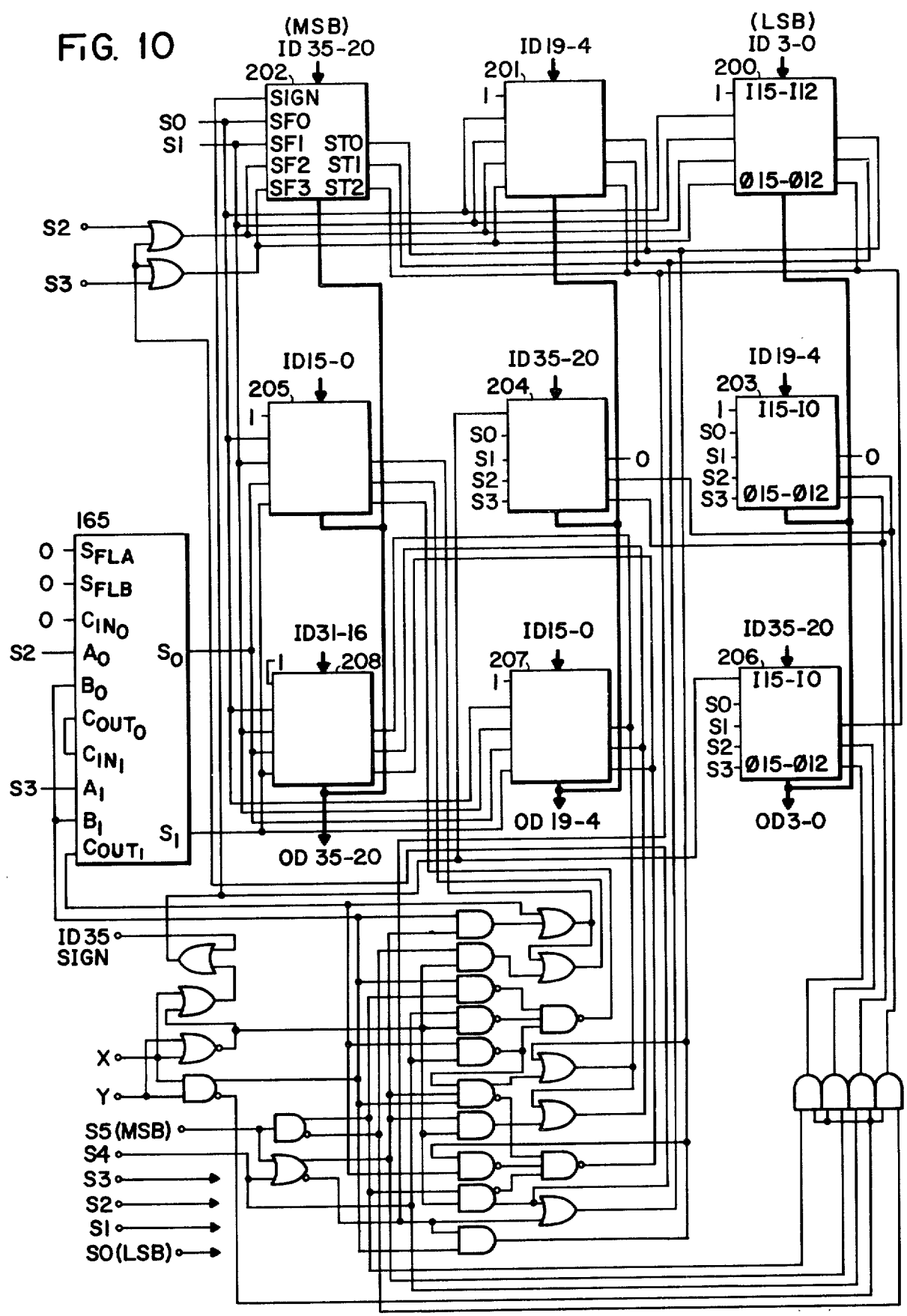
FIG. 10 is an embodiment of the invention capable of handling 36 bits of digital data.

FIG. 10 is an embodiment of a thirty-six bit shift/rotate array providing one integrated circuit chip delay for the digital data being processed. Input digital data bits 0 through 3 are received by the inputs to programmable data shifter 200. Input digital data bits 4 through 19 are received by the inputs of programmable data shifters 201 and 203. Input digital data bits 20 through 35 are connected to the inputs of programmable data shifters 202, 204, and 206. The outputs of shifters 200, 203, and 206 are connected together to provide output digital data bits 0 through 3. The outputs of shifters 201, 204, and 207 are connected together to provide output digital data bits 4 through 19, while the outputs of shifters 202, 205, and 208 are connected together to provide output digital data bits 20 through 35. Scale factor inputs S0 through S5 along with shift select inputs X and Y are used to control operation of the 36 bit shift/rotate array. A plurality of logic gates are used to receive the X and Y inputs and the two most significant scale factor inputs S4 and S5. The plurality of logic gates decodes these inputs and cooperate with the adder 165 to provide the proper commands to the programmable data shifters. Adder 165 is a two bit adder. An example of an adder that can be used for adder 165 is an MC10180 dual two bit adder/subtractor sold by Motorola, Inc. It should be noted that this 36 bit shift/rotate array uses less parts than does the array illustrated in FIG. 8.

Figure 11:
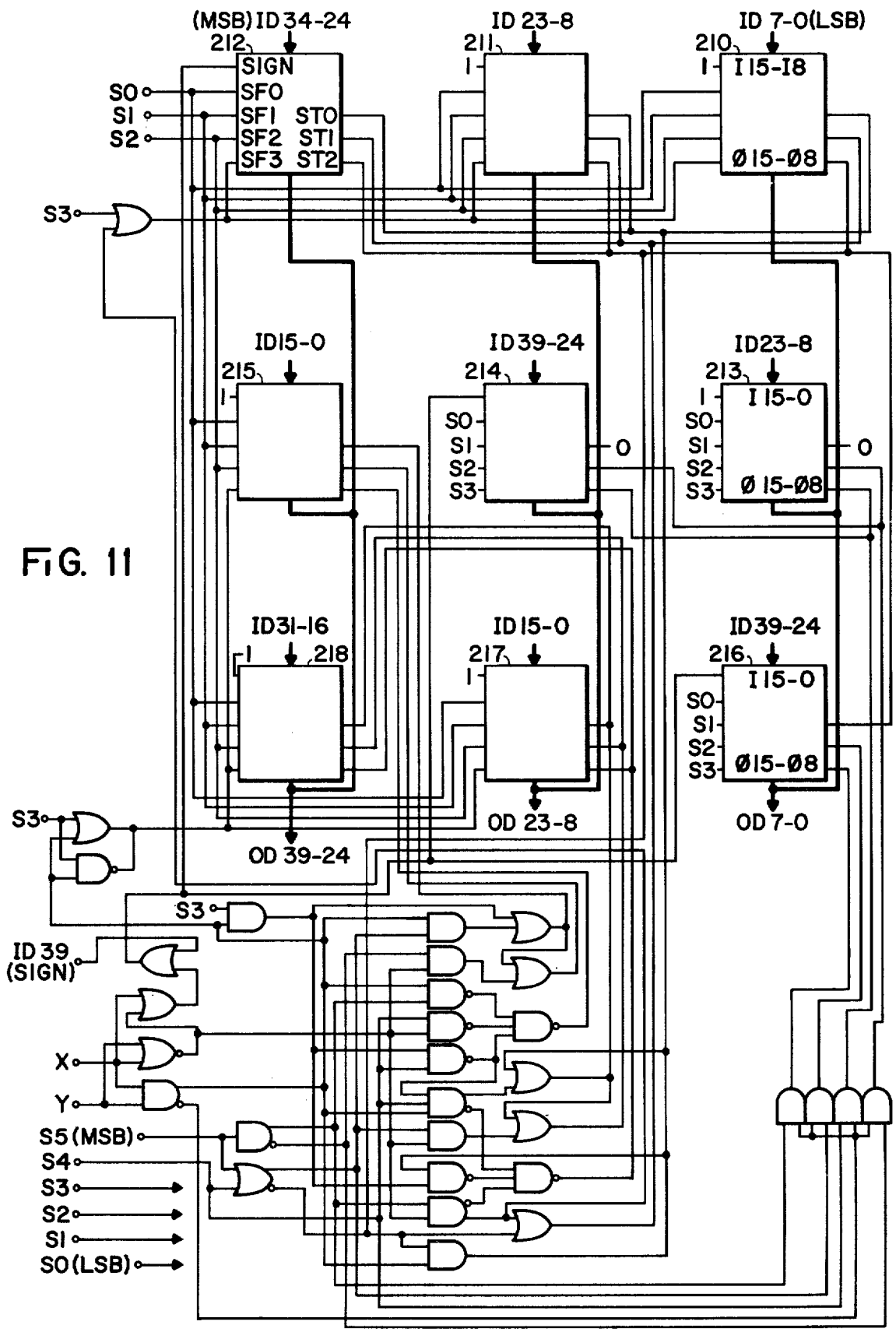
FIG. 11 is an embodiment of the invention capable of handling forth bits of digital data.

FIG. 11 illustrates a 40 bit shift/rotate array having one integrated circuit chip delay for the digital data processed therein. This 40 bit shift/rotate array has nine programmable data shifters 210 through 218 which are connected in a manner similar to the programmable shifters of FIG. 10. The inputs of shifters 211 and 213 are connected together as are the inputs of shifters 212, 214, and 216. Six scale factor inputs S0 through S5 are provided along with shift select inputs X and Y. A plurality of logic gates are used to decode command functions for the plurality of programmable data shifters.

Figure 12A:
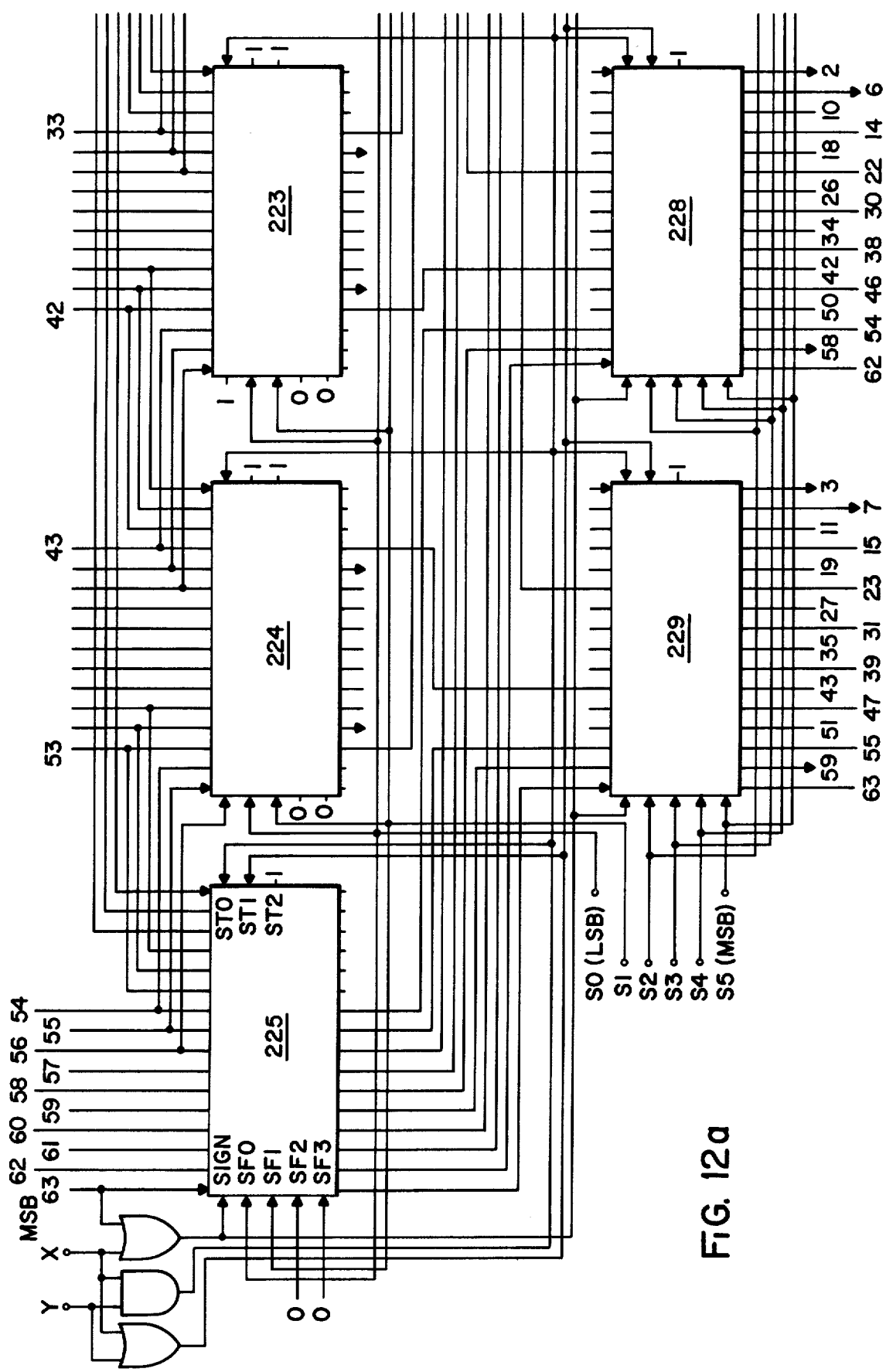
FIGS. 12a and 12b illustrates an embodiment of the invention capable of handling 64 bits of digital data.
Figure 12B:
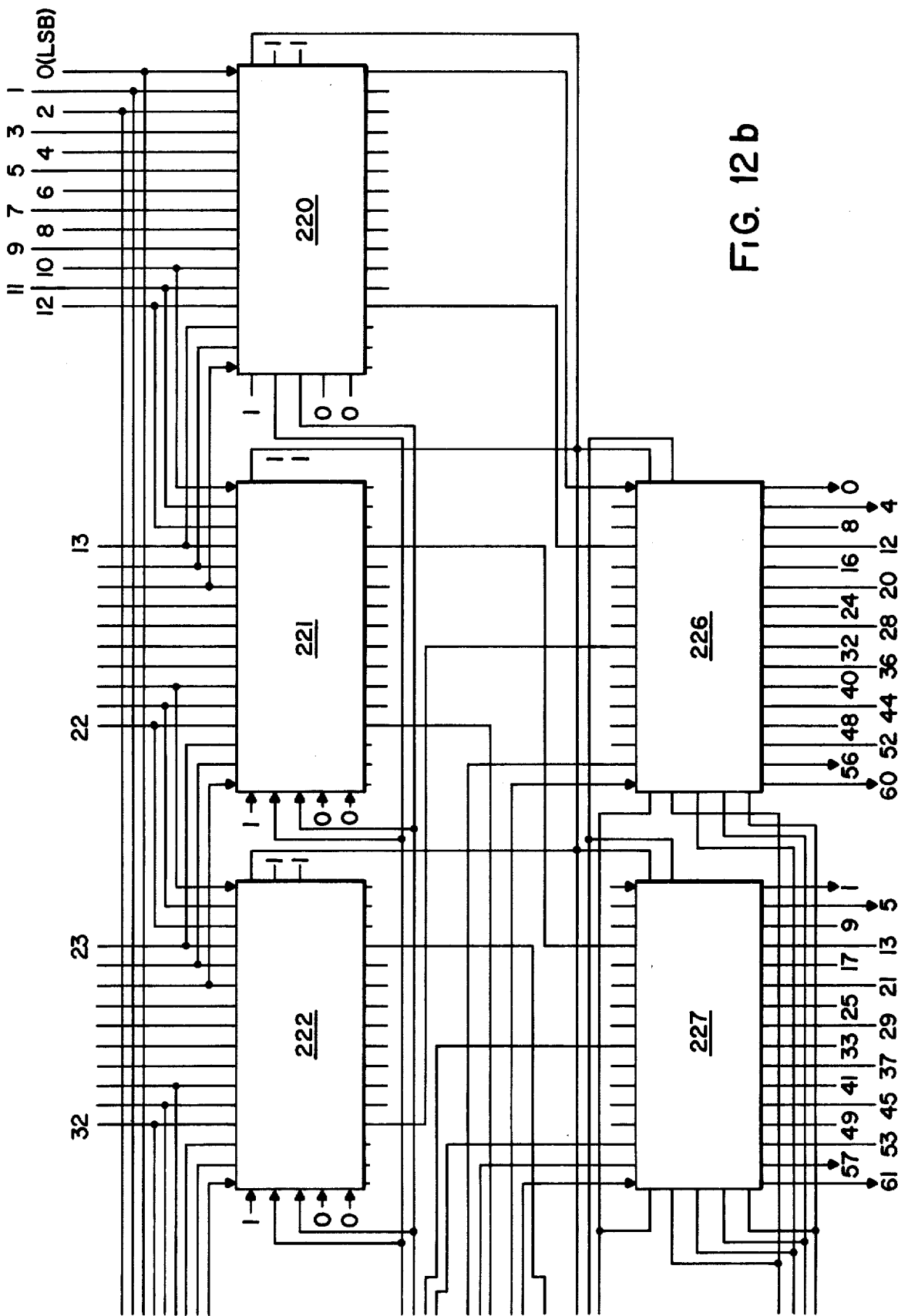

FIGS. 12a and 12b illustrate a 64 bit shift/rotate array having a two integrated circuit chip delay for the digital data being processed. FIGS. 12a and 12b are drawn so that the entire circuit can be seen by laying the FIGS. end-to-end with FIG. 12a on the left and FIG. 12b on the right, the interconnecting lines between the FIGS. will then be aligned. Programmable data shifters 220 through 225 receive the input digital data bits. Some of the input data bits are connected to more than one shifter so that these input bits can be used in shifting and rotating operations. The outputs of shifters 220 through 225 are connected to the inputs of programmable data shifters 226 through 229 in a staggered manner. As an example, output most significant bit 63 of shifter 225 is connected to input 63 of shifter 229. The next lower output bit 62 of shifter 225 is connected to the most significant input bit position of shifter 228. Output data bit 61 of shifter 225 is connected to the most significant input bit position for shifter 227. Output digital data bit 60 of shifter 225 is connected to the most significant input bit position for shifter 226. Output digital data bit 59 of shifter 225 is connected to the position adjacent to the most significant input bit position of shifter 229. The outputs for shifter 229 are then data bit 63 in the most significant output bit position and data bit 59 in the next adjacent output bit position. The outputs for shifters 220 through 224 are all connected to the inputs of shifters 226 through 229 in a similar manner as are the outputs of shifter 225. It should be noted that the outputs of shifters 226 through 229 are four digital data bits apart therefore the outputs will be shifted four positions for a one position shift command. The scale factor inputs S0 through S5 are directly connected to the programmable data shifters. Shift select functions X and Y are coupled to the programmable data shifters through three logic gates. With only the three logic gates the 64 bit array can still perform the same functions as the other arrays described hereinbefore. With the interconnection of the inputs of shifters 220 through 225, these shifters are used to shift data zero to three positions.

Figure 13A:
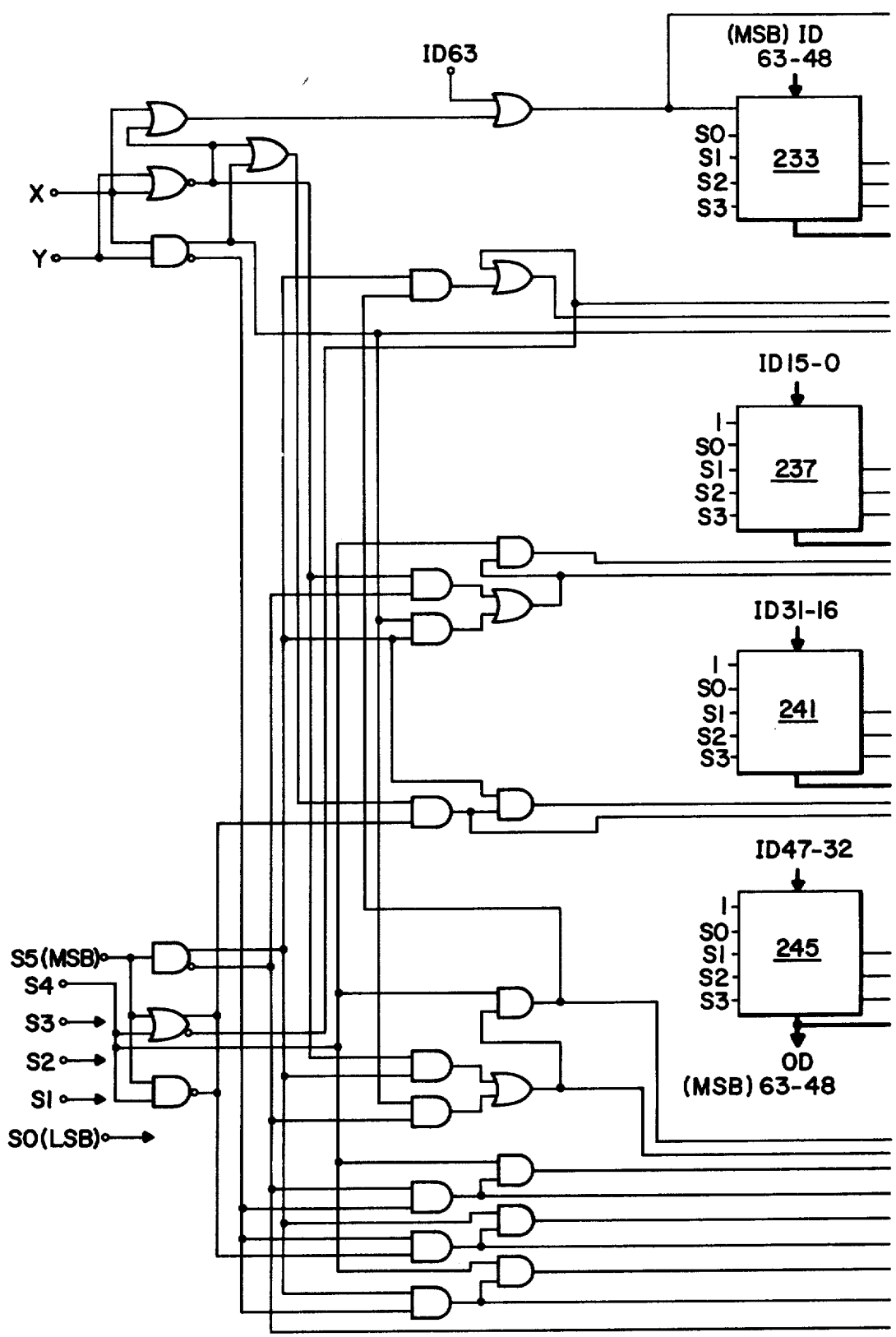
FIGS. 13a and 13b illustrate an embodiment of the invention capable of handling 64 bits of digital data with less time delay than does the embodiment illustrated in FIGS. 12a and 12b.
Figure 13B:
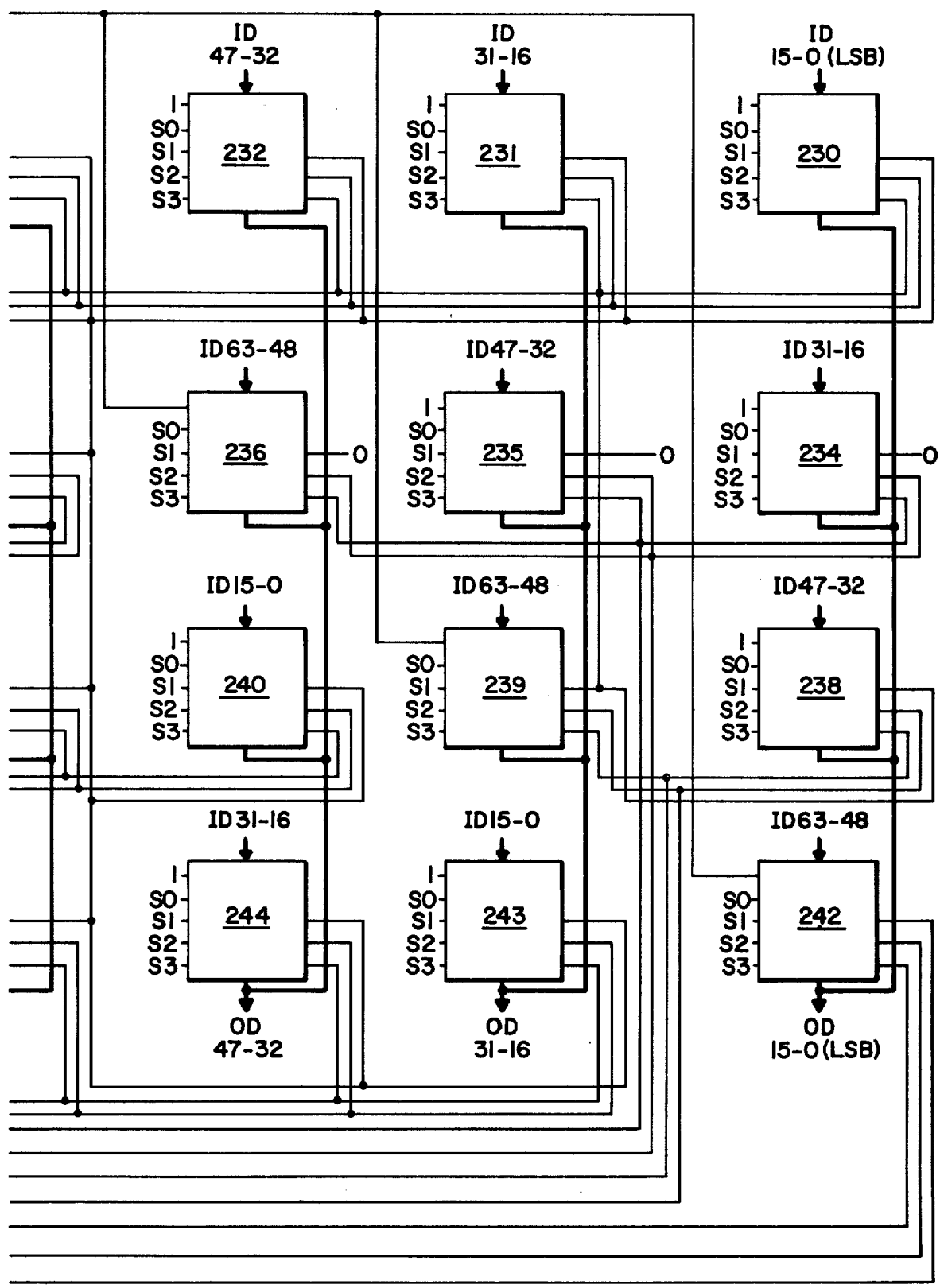

FIGS. 13a and 13b illustrate a sixty-four bit shift/rotate array having one integrated circuit chip delay. FIGS. 13a and 13b are drawn so that when they are arranged side-by-side with FIG. 13a on the left the interconnecting lines between the FIGS. will be aligned. In order to gain the additional shifting speed over the array illustrated in FIGS. 12a and 12b, additional programmable data shifters and logic gates are used. Input data bits 0 through 15 are connected to the inputs of programmable data shifters 230, 237, 240 and 243. Input digital data bits 16 through 31 are connected to the inputs of shifters 231, 234, 241, and 244. Input digital data bits 32 through 47 are connected to the inputs of shifters 232, 235, 238, and 245. Input digital data bits 48 through 63 are connected to the inputs of shifters 233, 236, 239, and 242. In this embodiment, the outputs of four programmable data shifters are connected together and may cause some output loading although it is believed that this output loading is insignificant. Shift select inputs X and Y are decoded by a plurality of logic gates and coupled to the programmable data shifters. Scale factor inputs S0 through S5 are also provided. The most significant data bit 63 of the input data (ID63) is used as a sign input to one of the logic gates.

FIG. 14 is a truth table for the 64 bit shift/rotate array illustrated in FIGS. 13a and 13b. The notation ID 63 in the sign bit column is to denote that the sign bit is the most significant input data bit 63.

Figure 15A:
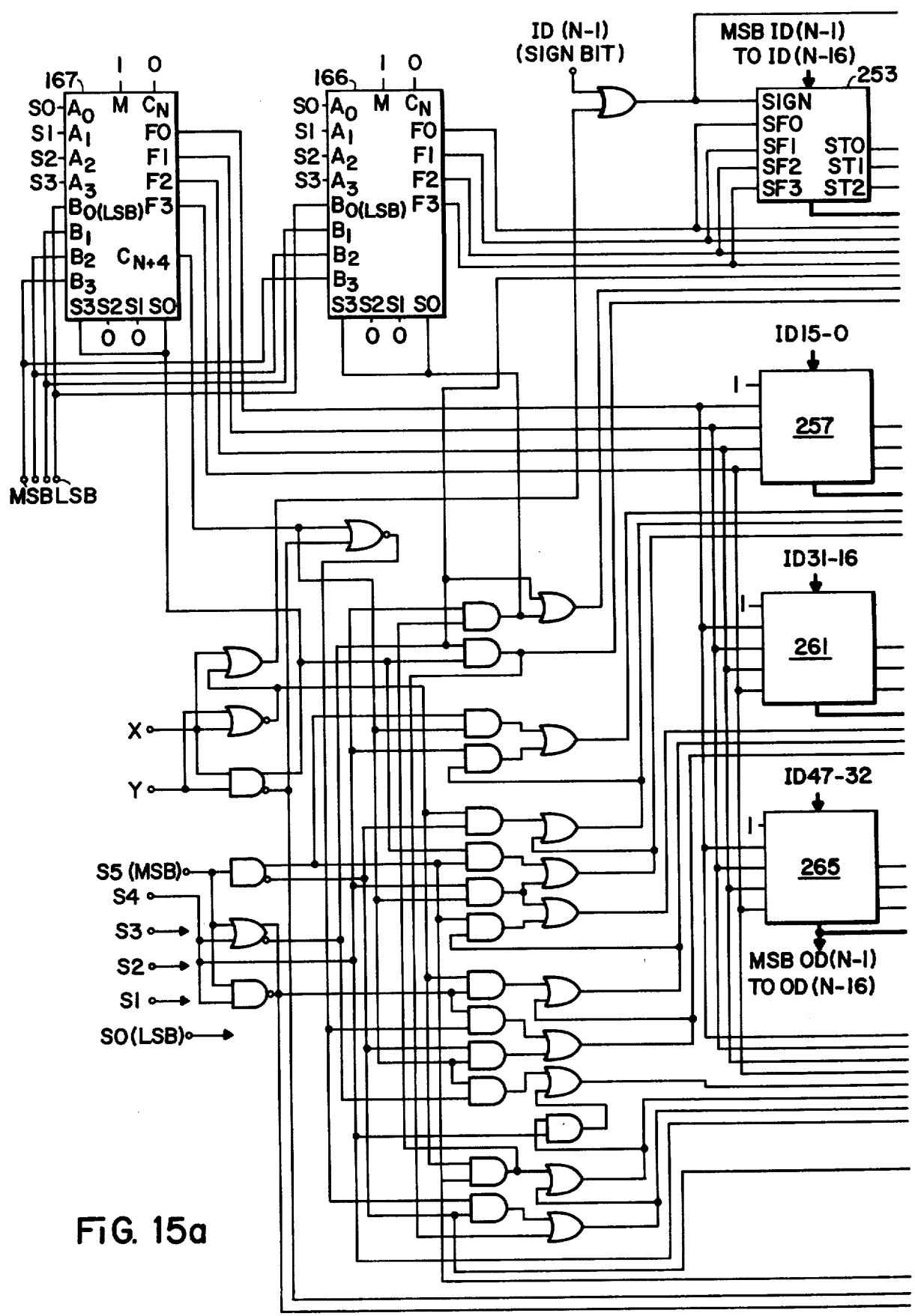
FIGS. 15a and 15b are an illustration of an embodiment of the invention capable of handling anywhere from 49 to 64 bits of digital data.
Figure 15B:
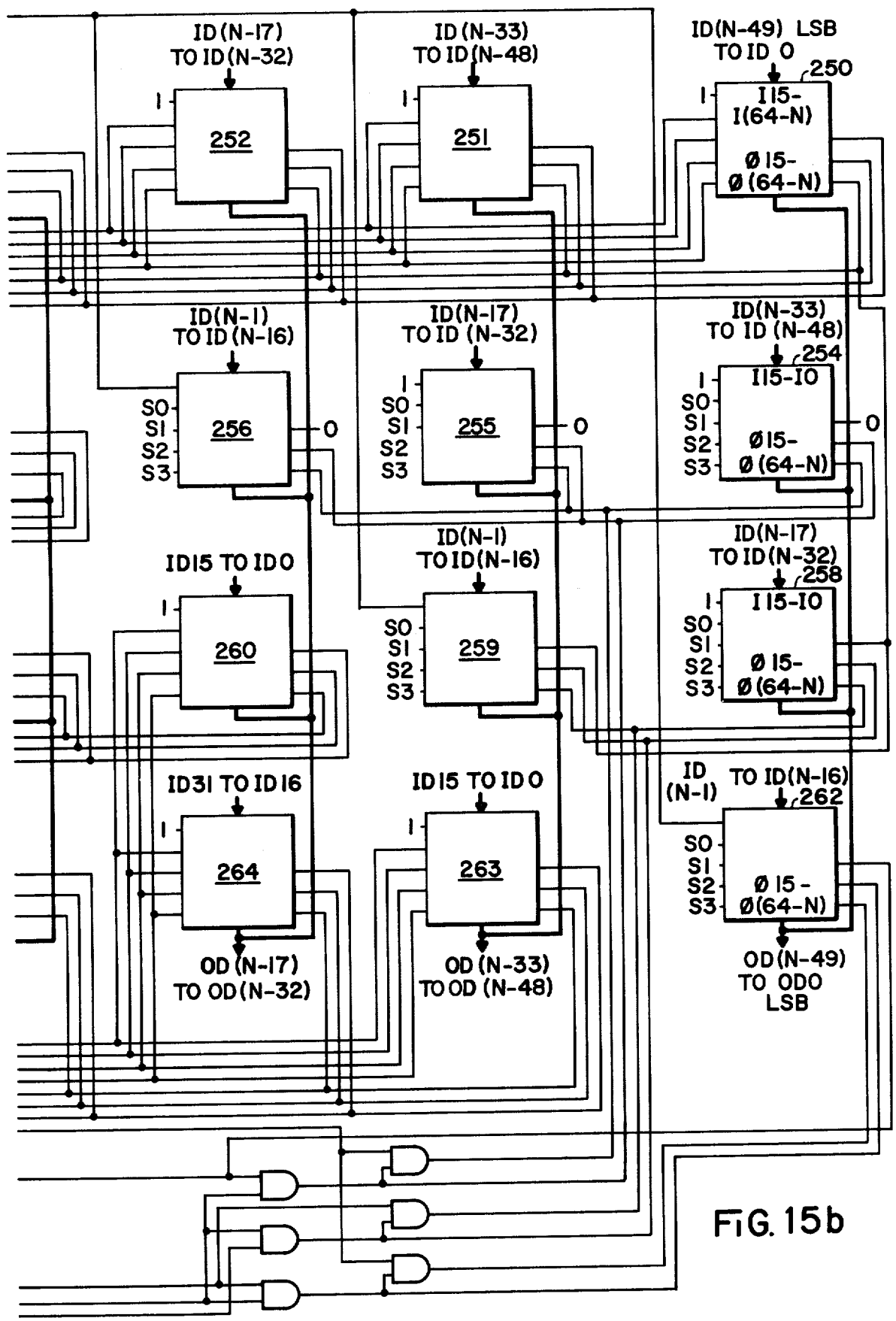

FIGS. 15a and 15b illustrate an N bit shift/rotate array wherein N can be any number of bits from 49 to 64. FIGS. 15a and 15b are drawn so that when they are arranged side-by-side, the lines interconnecting the FIGS. will be aligned. The sixteen programmable data shifters 250 through 265 are interconnected to produce a one integrated circuit chip time delay for the digital data. Input data bits 0 through N-49 are connected to the inputs of shifter 250. Input data bits N-48 through N-33 are connected to the inputs of data shifters 251 and 254. Input data bits N-32 through N-17 are connected to the inputs of shifters 252, 255 and 258. Input data bits N-16 through N-1 are connected to the inputs of shifters 253, 256, 259, and 262. Two adders 166 and 167 are used having inputs S0 through S3 and a binary code of 64-N. Shift select inputs X and Y are decoded by a plurality of logic gates and connected to the programmable data shifters. Six scale factor inputs S0 through S5 are also provided.

Figure 16:
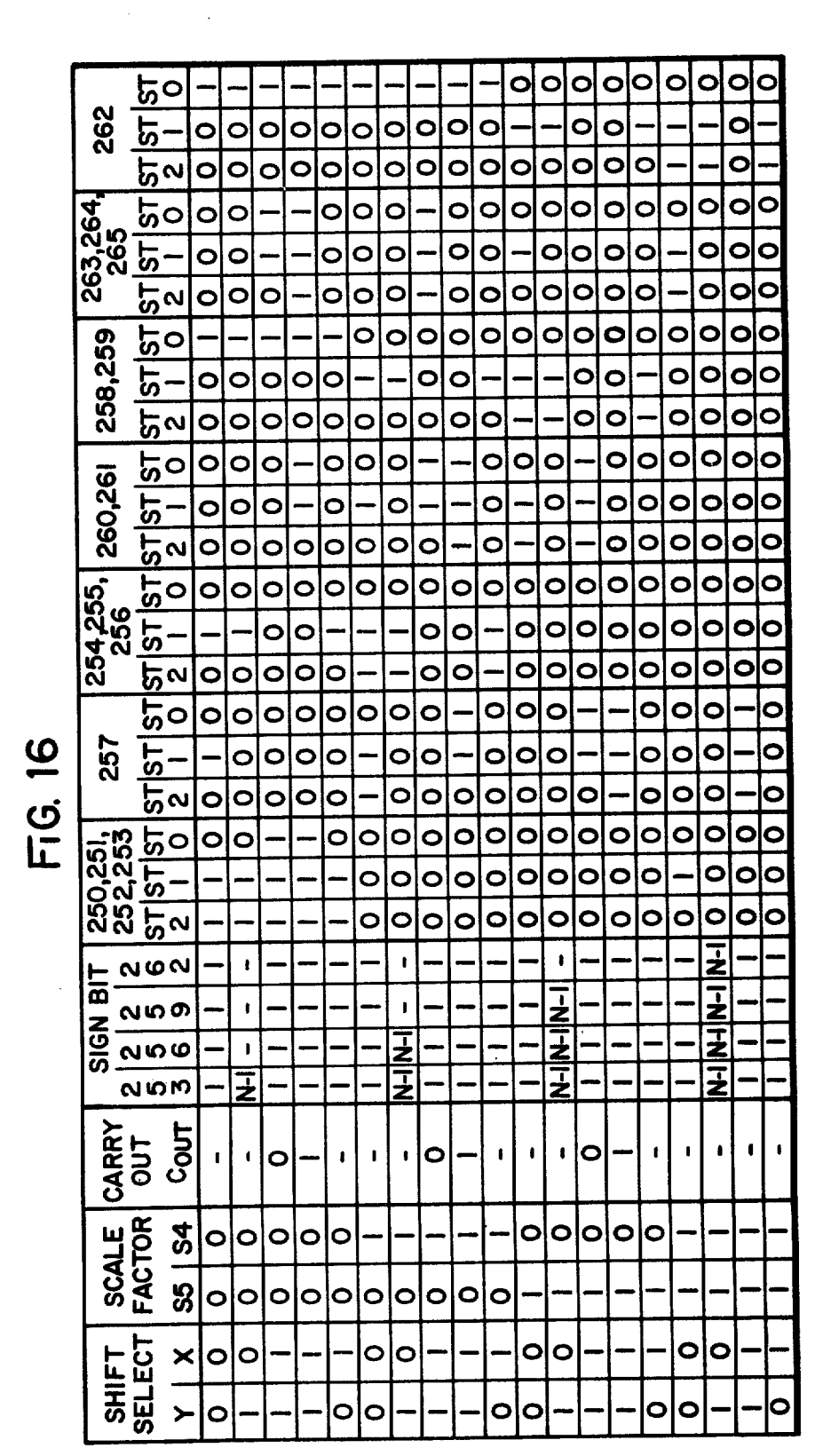

FIG. 16 is a truth table for the N bit shift/rotate array illustrated in FIGS. 15a and 15b.

Figure 17A:
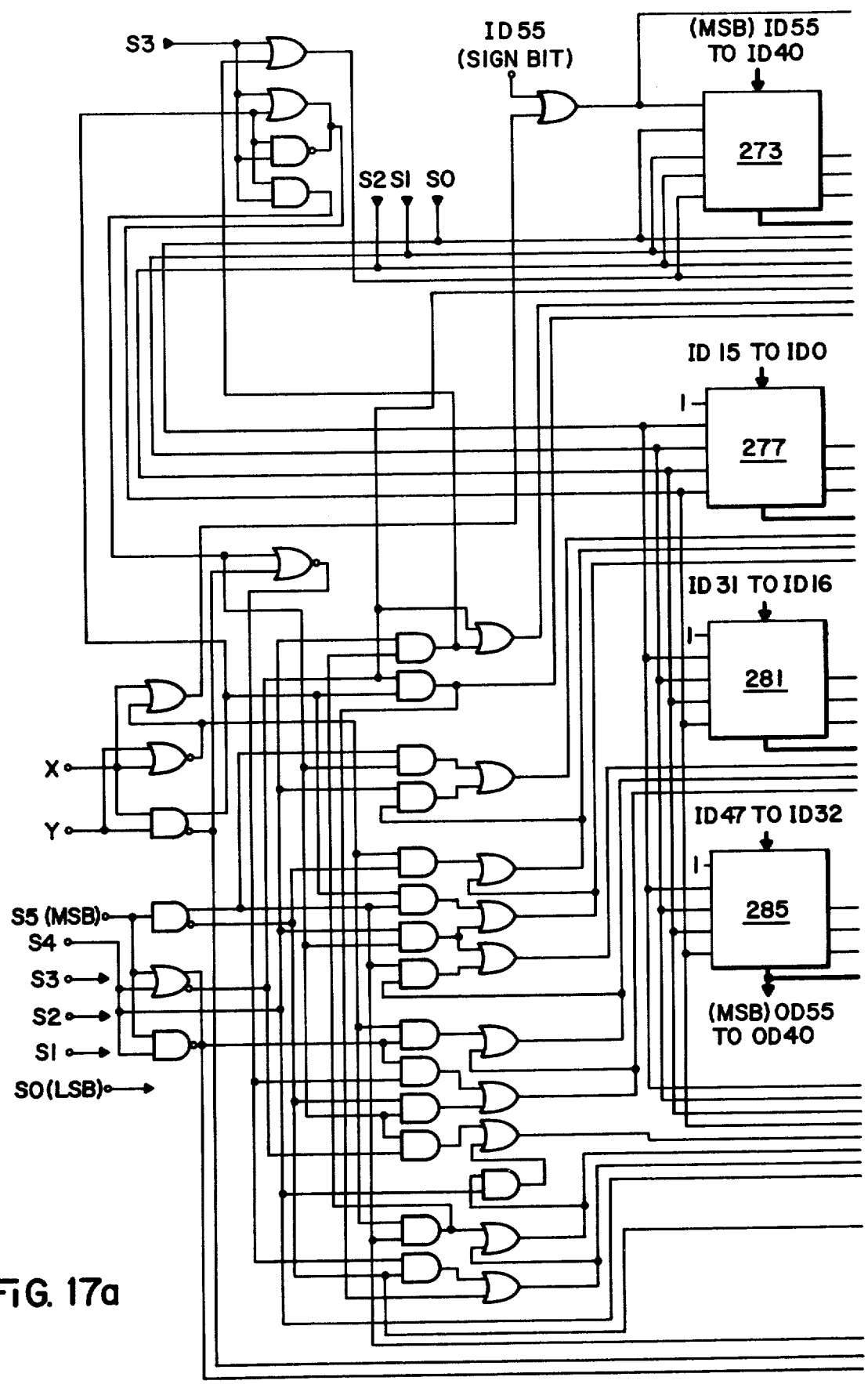
FIGS. 17a and 17b illustrate an embodiment of the invention capable of handling fifty-six bits of digital data.
Figure 17B:
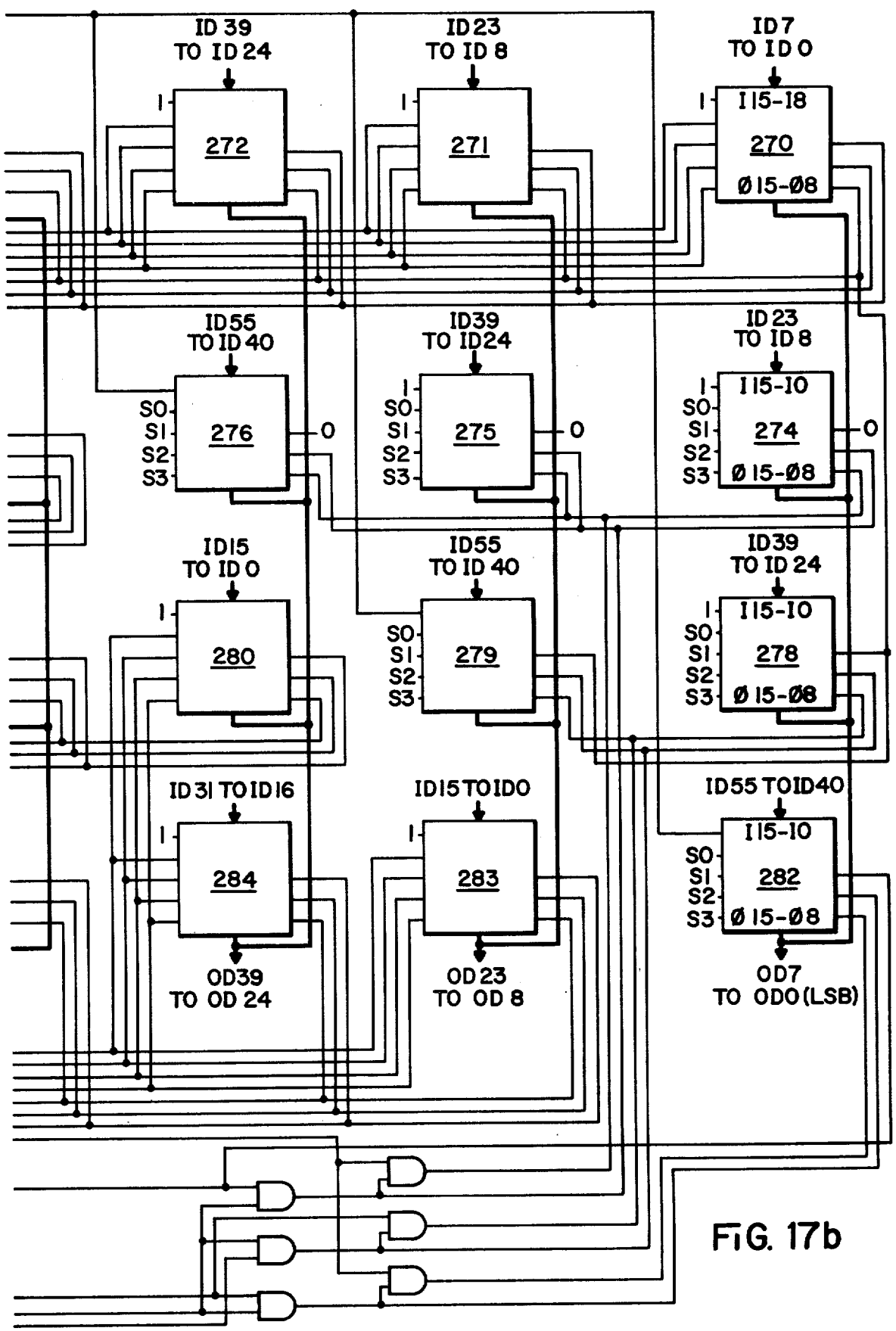

FIGS. 17a and 17b illustrate a 56 bit shift/rotate array having one integrated circuit chip delay for the digital data being processed. FIGS. 17a and 17b are drawn so that when arranged side-by-side the interconnecting lines from one figure to the other will be aligned. Sixteen programmable data shifters 270 through 285 are interconnected as are the sixteen programmable data shifters of FIGS. 15a and 15b. The most significant bit of input data bit 55 is used as a sign bit input. Shift selects X and Y are coupled and decoded by a plurality of logic gates to the programmable data shifters. Six scale factor inputs S0 through S5 are also provided. This array uses less parts than does the array illustrated in FIGS. 15a and 15b, however, it should be noted that this array is only capable of handling fifty-six bits of data.

Although the arrays illustrated in the first few FIGS. were discussed with greater detail than some of the later ones, it will be apparent to those skilled in the art the operation of the later ones after following the discussion with the prior ones.

A one hundred and twenty-eight data bit shift/rotate array can be provided from 24 programmable data shifters and five logic gates by following the teachings set out hereinbefore. A first row of eight shifters receive the input data. A second row of eight shifters have their inputs connected to the inputs of the first row of eight shifters in groups of eight so that the right most shifter receives inputs 16-23, the next adjacent receives 32-39 and 8-15, and so on until the left most shifter receives 0-7 and 104-111 input data bits. Input data bits 120-127 are not connected to the inputs of the second row. The outputs of the first and second row of shifters are connected together and go to inputs of a third row of eight shifters in a staggered manner so that the outputs of the third row are eight bits apart. Another array having 63 programmable data shifters interconnected in a similar manner can handle 256 bits of digital data. The shifters are arranged in four rows of 16 except for the third row which only has fifteen shifters. Four logic gates are used to receive and decode the X and Y shift select inputs for such a 256 bit shift/rotate array.

By now it should be appreciated that there has been provided a high speed digital data array capable of rotating and shifting many bits of digital data. The arrays provided have a reduced number of packages and therefore occupy less volume, while lowering cost, require less wiring, and consume less power. The arrays provided are capable of handling digital data in a parallel format.

While the present invention has been described with reference to particular embodiments and exemplifications thereof in accordance with the patent Statutes, it is to be understood that modifications may be made by those skilled in the art without actually departing from the invention. Therefore, it is intended in the appended claims to cover all such equivalent variations as come within the spirit and scope of the invention.

What is claimed as new and desired to be secured by Letters Patent of the United States is:

1. A high speed digital data shifter array for shifting digital data in parallel including a plurality of 16 bit programmable data shifters each having a sign bit input, a plurality of scale factor inputs, and a plurality of shift function command inputs, the array comprising: a predetermined number of the sixteen bit programmable data shifters arranged to receive input data and to provide output data, each of the programmable data shifters providing at least rotate right, rotate left, arithmetic shift right, arithmetic shift left, shift left using two's complements, and shift right using two's complement operations in response to input commands; a plurality of scale factor inputs coupled to the plurality of scale factor inputs of the programmable data shifters for selecting the number of positions data is to be shifted by the 16 bit programmable data shifter; and a plurality of logic gates for receiving and decoding input commands for the shifter array, the plurality of logic gates having outputs to provide decoded control commands which are coupled to the plurality of shift function command inputs of the predetermined number of sixteen bit programmable shifters so that the shifter array can shift and can rotate the input data in response to the input commands and can place the sign bit at the outputs in response to a predetermined input command.

2. A 32 data bit array for shifting and for rotating digital data in parallel, comprising: four programmable data shifters each having inputs for receiving sixteen input data bits and providing sixteen output data bits and each having scale factor select inputs for selecting the number of positions data is to be shifted and shift function command inputs to control shifting and rotating functions, two of the four programmable data shifters arranged to receive 32 bits of input data and to each provide outputs which are coupled to the other two programmable data shifters, the other two programmable data shifters providing 32 bits of output data; and a plurality of logic gates for decoding at least two shift function select inputs and having outputs coupled to the four programmable data shifters to control rotate right shift, logic shift right, arithmetic shift right, and logic shift left operation of the array; and a plurality of input terminals coupled to the data shifters for controlling number of positions data is shifted and rotated by the array.

3. The array of claim 2 wherein the plurality of input terminals equals four and further wherein one of the four input terminals is coupled to the two programmable shifters arranged to receive 32 bits of input data and three of the four input terminals are coupled to the other two programmable data shifters.

4. A 32 data bit shift/rotate array having programmable sixteen bit shifters, comprising: a first programmable 16 bit shifter for receiving a first 16 bits of input data and providing 16 bits of output data; a second programmable 16 bit shifter for receiving a second 16 bits of input data and providing 16 bits of output data, the first and second programmable 16 bit shifters thereby receiving a total of 32 bits of input data; a third programmable 16 bit shifter having a plurality of inputs coupled to receive the second 16 bits of input data and having a plurality of outputs, the plurality of outputs being coupled in common with the outputs of the first programmable 16 bit shifter; a fourth programmable 16 bit shifter having a plurality of inputs coupled to receive the first 16 bits of input data and having a plurality of outputs which are coupled in common with the outputs of the second programmable 16 bit shifter, the outputs of the third and fourth programmable 16 bit shifters providing a 32 bit output for the array; a plurality of scale factor input terminals for receiving scale factor commands, the terminals being coupled to the first, second, third and fourth programmable 16 bit shifters for controlling number of positions data is shifted within each shifter; at least two shift select terminals for receiving shift function commands; and a plurality of logic gates coupled to the at least two shift select terminals for decoding the shift function commands, the plurality of logic gates having outputs coupled to the programmable shifters for controlling operation of the programmable shifters.

5. A high speed digital data bit shifting array for handling N bits of digital data in parallel wherein N is a number greater than 16 and less than 65 and comprising a plurality of programmable 16 bit shifters, each programmable shifter having inputs for 16 data bits and having a corresponding number of outputs, the number of programmable shifters is determined by dividing N by 16 and rounding off to the next higher integer and then squaring the integer, input data terminals being coupled to a first number of programmable shifters equal to the integer, the outputs of each respective programmable shifter of the first number of programmable shifters coupled to outputs of a second number of programmable shifters equal to the integer; a plurality of scale factor terminals for receiving scale factor commands to control number of positions that data is shifted by the array, the scale factor terminals being coupled to the programmable shifters; at least one adder for controllably adding the scale factor commands to a number equal to the integer minus N, the at least one adder having a plurality of outputs coupled to predetermined programmable shifters; and a plurality of logic gates for receiving and decoding shift function commands and having outputs coupled to the programmable shifters for programmable operation of the shifters.

6. A digital data array for shifting and for rotating digital data, the array having capability of handling up to 48 bits of data in a parallel format, comprising: a first programmable data shifter having 16 inputs and outputs; a second programmable data shifter having 16 inputs and outputs; a third programmable data shifter having 16 inputs and outputs; a fourth programmable data shifter having inputs coupled to the inputs of the second programmable shifter and having outputs coupled to the outputs of the first programmable shifter; a fifth programmable data shifter having inputs coupled to the inputs of the third programmable shifter and having outputs coupled to the outputs of the second programmable shifter; a sixth programmable data shifter having inputs coupled to the inputs of the first programmable shifter and having outputs coupled to the outputs of the third programmable shifter; a seventh programmable data shifter having inputs coupled to the inputs of the third programmable shifter and having outputs coupled to the outputs of the first and fourth programmable shifters; an eighth programmable data shifter having inputs coupled to the inputs of the first programmable shifter and having outputs coupled to the outputs of the second and fifth programmable shifters, a ninth programmable data shifter having inputs coupled to the inputs of the second programmable shifter and having outputs coupled to the outputs of the third and sixth programmable shifters; a plurality of logic gates for receiving and decoding shift function commands, the plurality of logic gates having outputs coupled to the programmable data shifters for controlling shifting or rotating operations of the programmable shifters; and a plurality of scale factor input terminals for receiving scale factor commands, the scale factor terminals being coupled to the programmable data shifters for controlling number of positions that data is shifted by the programmable shifters, each of the programmable shifters being capable of performing at least arithmetic shift right, logic shift right, and shift right using two's complement.

7. A digital data shifting array for shifting and for rotating up to 64 bits of data in parallel, comprising: a first programmable data shifter having a plurality of inputs for receiving input data and having a plurality of outputs; a second programmable data shifter having a plurality of inputs for receiving input data and having a plurality of outputs, at least one of the inputs being coupled to an input of the first programmable data shifter; a third programmable data shifter having a plurality of inputs for receiving input data and having a plurality of outputs, at least one of the inputs being coupled to an input of the second programmable data shifter; a fourth programmable data shifter having inputs for receiving input data and having a plurality of outputs, at least one of the inputs being coupled to an input of the third programmable data shifter; a fifth programmable data shifter having a plurality of inputs for receiving input data and a plurality of outputs, at least one of the inputs being coupled to an input of the fourth programmable data shifter; a sixth programmable data shifter having a plurality of inputs for receiving input data and having a plurality of outputs, at least one of the inputs being coupled to an input of the fifth programmable data shifter, and at least another of the inputs being coupled to one of the plurality of inputs of the first programmable data shifter; a seventh programmable data shifter having a plurality of inputs coupled to the outputs of the first, third and sixth programmable data shifters, and having a plurality of outputs for providing outputs for the shifting array; an eighth programmable data shifter having a plurality of inputs coupled to outputs of the second, fourth, fifth and sixth programmable shifters, and having a plurality of outputs for providing outputs for the shifting array; a ninth programmable data shifter having a plurality of inputs coupled to outputs of the second, fourth and sixth programmable shifters, and having a plurality of outputs for providing outputs for the shifting array; a tenth programmable data shifter having a plurality of inputs coupled to outputs of the third, fifth and sixth programmable shifters, and having a plurality of outputs for providing outputs for the shifting array; a plurality of scale factor terminals for receiving scale factor commands and being coupled to the programmable data shifters for controlling number of positions data is shifted by the programmable data shifters; at least two shift function select terminals for receiving input commands; at least three logic gates having inputs coupled to the at least two terminals for decoding the input commands, the at least three logic gates having outputs coupled to the programmable data shifters for programming the data shifters so that the data can be shifted or rotated in response to the input commands.

8. The digital shifting array of claim 7 wherein each programmable data shifter can handle up to sixteen bits of data.

9. The digital data shifting array of claim 7 wherein the at least three logic gates are a first OR gate, an AND gate, and a second OR gate, and further wherein a first shift select terminal is connected to an input of the first OR gate and to an input of the AND gate and a second shift select terminal is connected to an input of the first and second OR gates and of the AND gate, the second OR gate also having an input connected to the most significant bit of the input data.

10. A digital data shifter array for controllably shifting or rotating a plurality of digital data bits in parallel format, comprising: a first programmable data shifter for receiving a portion of input digital data and having outputs; a second programmable data shifter for receiving another portion of input digital data and having outputs; a third programmable data shifter for receiving yet another portion of input digital data and having outputs; a fourth programmable data shifter for receiving a further portion of input digital data and having outputs; a fifth programmable data shifter having inputs coupled to inputs of the second programmable data shifter, and having outputs coupled to the outputs of the first programmable data shifter; a sixth programmable data shifter having inputs coupled to inputs of the third programmable data shifter and having outputs coupled to the outputs of the second programmable data shifter; a seventh programmable data shifter having inputs coupled to inputs of the fourth programmable data shifter, and having outputs coupled to the outputs of the third programmable data shifter; an eighth programmable data shifter having inputs coupled to inputs of the first programmable data shifter, and having outputs coupled to the outputs of the fourth programmable data shifter; a ninth programmable data shifter having inputs coupled to inputs of the third programmable data shifter, and having outputs coupled to the outputs of the first programmable data shifter; a tenth programmable data shifter having inputs coupled to inputs of the fourth programmable data shifter, and having outputs coupled to outputs of the second programmable data shifter; an eleventh programmable data shifter having inputs coupled to inputs of the first programmable data shifter, and having outputs coupled to outputs of the third programmable data shifter; a twelfth programmable data shifter having inputs coupled to inputs of the second programmable data shifter, and having output coupled to the outputs of the fourth programmable data shifter; a thirteenth programmable data shifter having inputs coupled to inputs of the fourth programmable data shifter, and having outputs coupled to the outputs of the first programmable data shifter; a fourteenth programmable data shifter having inputs coupled to inputs of the first programmable data shifter, and having outputs coupled to the outputs of the second programmable data shifter; a fifteenth programmable data shifter having inputs coupled to inputs of coupled to the outputs of the third programmable data shifter; a sixteenth programmable data shifter having inputs coupled to inputs of the third programmable data shifter, and having outputs coupled to the outputs of the fourth programmable data shifter so that outputs for the shifter array are taken from the outputs of the thirteenth, fourteenth, fifteenth, and sixteenth programmable shifter and all the outputs coupled thereto respectively; a plurality of scale factor input terminals for receiving scale factor command inputs and being coupled to the programmable data shifters for controlling the number of positions the data is shifted; and a plurality of logic gates for receiving and decoding shift select functions, and having outputs coupled to the programmable data shifters for controlling at least rotate right, shift right using two's complement, or arithmetic shift left operation of the programmable data shifters.

11. The digital data shifter array of claim 10 wherein one of the plurality of logic gates has an input coupled to a predetermined input data bit of one of the programmable data shifters to generate a sign bit which can appear at the output of the data shifters upon a predetermined shift select function.

12. The digital data shifter array of claim 10 further including at least one adder having inputs coupled to the scale factor terminals for controllably adding commands from the scale factor terminals to a preset number, and having outputs coupled to predetermined programmable data shifters.

13. The digital data shifter array of claim 10 wherein each programmable data shifter can handle sixteen bits of data.

14. A high speed digital data shifter capable of processing a plurality of data bits in parallel, comprising a plurality of programmable data shifters arranged in an array and having data input terminals and data output terminals, the array of programmable data shifters being capable of at least rotating data right, performing a logic shift right and an arithmetic shift right, and of rotating data left; a plurality of scale factor terminals for receiving scale factor commands, the scale factor terminals being coupled to the programmable data shifters for controlling number of positions that data is shifted by each programmable data shifter; and a plurality of logic gates for receiving and decoding shift function commands, the plurality of logic gates having outputs for providing shift function controls for the programmable data shifters, the shift function commands controlling at least logic shift right, arithmetic shift right, rotating data right, and rotating data left operations, the programmable data shifters each having inputs and outputs wherein the inputs are coupled to the data input terminals and the outputs are coupled to the data output terminals.

15. The high speed digital data shifter of claim 14 wherein each programmable data shifter of the plurality of programmable data shifters is a sixteen bit data shifter.

* * * * *